(12) United States Patent
Joo et al.

(10) Patent No.: US 7,812,797 B2
(45) Date of Patent: *Oct. 12, 2010

(54) ORGANIC LIGHT EMITTING DEVICE

(75) Inventors: In-Su Joo, Seongnam-si (KR);
Young-Chol Yang, Seongnam-si (KR);
Keun-Kyu Song, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 1495 days.

This patent is subject to a terminal disclaimer.

(21) Appl. No.: 11/176,280

(22) Filed: Jul. 8, 2005

(65) Prior Publication Data

US 2006/0007077 A1    Jan. 12, 2006

(30) Foreign Application Priority Data

Jul. 9, 2004   (KR)   .................. 10-2004-0053302

(51) Int. Cl.
G09G 3/30 (2006.01)
(52) U.S. Cl. .................... 345/77; 345/82; 315/169.3

(58) Field of Classification Search .............. 345/77, 345/76, 82, 83, 694, 695; 382/162, 167; 349/106, 114, 143, 144; 430/7; 257/83, 257/84, E51.018; 330/500, 505; 315/169.1, 315/169.3; 235/462.42; 445/24
See application file for complete search history.

(56) References Cited

U.S. PATENT DOCUMENTS

| 6,077,634 | A | * | 6/2000 | Phillips | .................. 430/7 |
| 2002/0014837 | A1 | * | 2/2002 | Kim et al. | .................. 313/505 |

OTHER PUBLICATIONS

Billmeyer and Saltzman, "Principles of Color Technology", second edition, John Wiley & Sons, Inc. 1981, p. 50.

* cited by examiner

*Primary Examiner*—Abbas I Abdulselam
(74) *Attorney, Agent, or Firm*—Cantor Colburn LLP

(57) ABSTRACT

An organic light emitting device includes first and second sub pixels. The first sub pixel includes at least one first sub pixel that emits a light of original colors, and the second sub pixel includes at least one second sub pixel that emits a light of complementary colors, wherein a specific sub pixel is selected from the first and second sub pixels and a light emitting efficiency of a remaining sub pixels are adjusted according to a light emitting efficiency of a selected sub pixel from among the first and second sub pixels, so that the OLED displays a white color when each sub pixel emits a maximum amount of light.

19 Claims, 19 Drawing Sheets

ORGANIC LIGHT EMITTING DEVICE

CROSS-REFERENCE TO RELATED APPLICATIONS

This application claims priority to and the benefit of Korean Patent Application No. 2004-53302 filed on Jul. 9, 2004, which is hereby incorporated by reference for all purposes as if fully set forth herein.

BACKGROUND OF THE INVENTION

1. Field of the Invention

The present invention relates to an organic light emitting device. More particularly, the present invention relates to an organic light emitting device with an improved white color balance.

2. Description of the Related Art

Flat panel display devices such as an organic light emitting device (OLED), a plasma display panel (PDP), a liquid crystal display device (LCD), display colors by adding different amounts of three base colors. A region including specific color coordinates corresponds to a specific color.

When an original color system such as red, green and blue (RGB), or a complementary color system, such as cyan, magenta and yellow (CMY) is applied to the OLED, organic electroluminescent layer efficiency differs according to the colors. Therefore, when a size or thickness of sub pixels corresponding to each color is the same, a proper white color may not be displayed due to efficiency differences associated with each color.

SUMMARY OF THE INVENTION

The present invention provides an organic light emitting device with enhanced white color balance.

Additional features of the invention will be set forth in the description which follows, and in part will be apparent from the description, or may be learned by practice of the invention.

The present invention discloses an organic light emitting device, including a first sub pixel part having a first sub pixel emitting a light of a primary color, and a second sub pixel part having a second sub pixel emitting a light of a complementary color, wherein a specific sub pixel of the first sub pixel or the second sub pixel is selected and a light emitting efficiency of the sub pixels not selected is adjusted according to a light emitting efficiency of the selected sub pixel.

The present invention also discloses an organic light emitting device, including an organic light emitting panel having a plurality of data lines, a plurality of scan lines, a plurality of power supplying lines, and a first light emitting part and a second light emitting part formed in a region defined by each of the data lines and each of the scan lines and displaying original colors and complementary colors, respectively, a timing controller outputting image data and first, second, and third timing signals corresponding to the original colors or the complementary colors, a data driver applying the image data to the data lines according to the first timing signal, a scan driver applying a scan signal to the scan lines according to the second timing signal, and a power supplier applying different bias currents to the power supplying lines according to the third timing signal.

The present invention also discloses an organic light emitting device, including a substrate, a plurality of switching devices formed on the substrate, and a plurality of pixel electrodes coupled with drain electrodes of the switching devices to form first, second, third, fourth, fifth, and sixth sub pixels, wherein the first sub pixel is a red sub pixel emitting a red light, wherein the second sub pixel is a green sub pixel emitting a green light, wherein the third sub pixel is a blue sub pixel emitting a blue light, wherein the fourth sub pixel is a cyan sub pixel emitting a cyan light; wherein the fifth sub pixel is a magenta sub pixel emitting a magenta light, and wherein the sixth sub pixel is a yellow sub pixel emitting a yellow light.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the is principles of the invention.

DESCRIPTION OF THE ILLUSTRATED EMBODIMENTS

Figure 1:
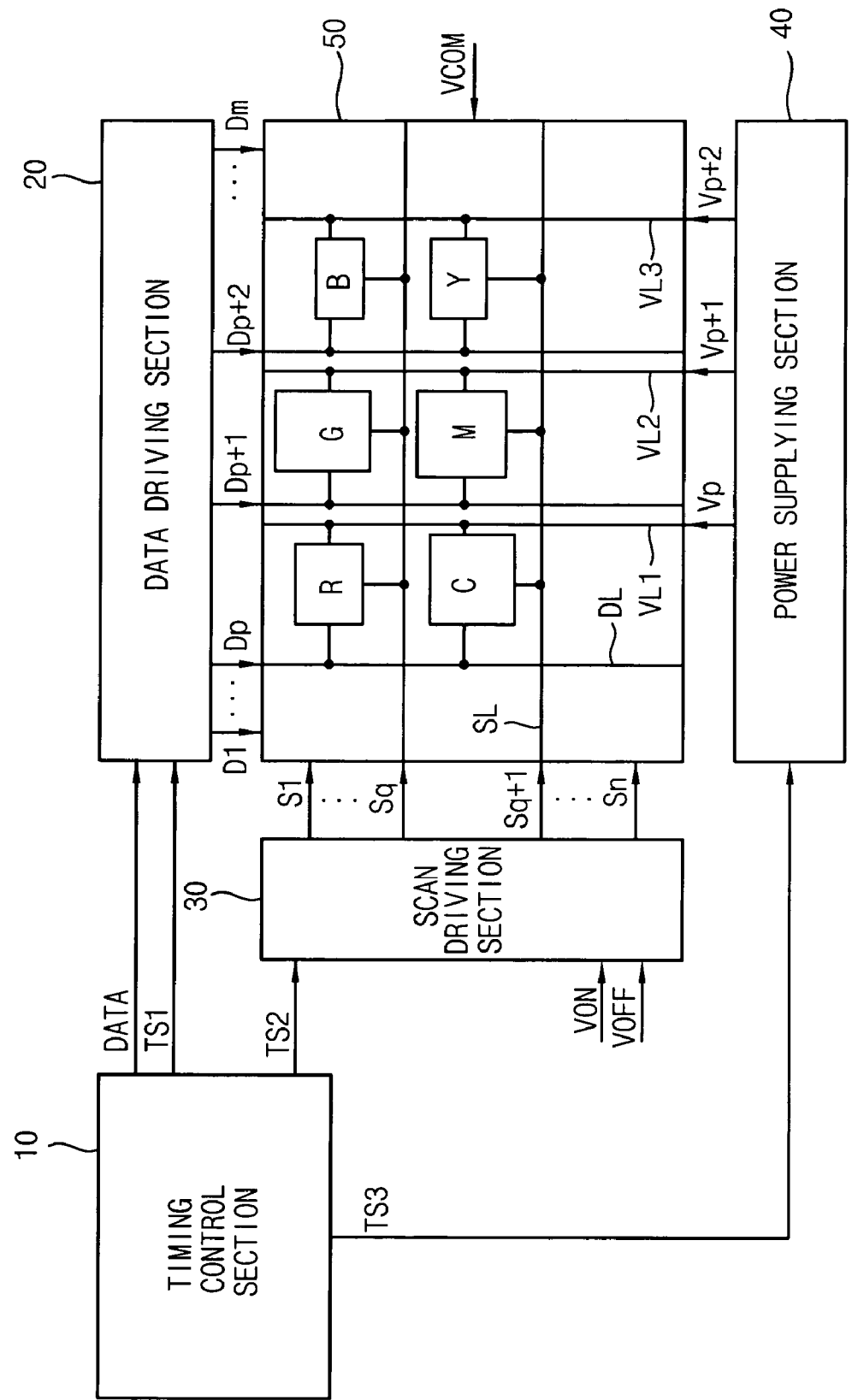
FIG. 1 is a schematic block diagram illustrating an OLED according to an embodiment of the invention.

Hereinafter, the embodiments of the present invention are described in detail with reference numerals to the accompanied drawings. The present invention is not limited to the drawings, which are examples, and modification may be possible. In the drawings, a thickness of layers (or films) is enlarged clearly show the layers. The same reference numerals refer to the same or like parts.

When a layer, a film, a region, a plate, or the other is disposed "on" something, it does not necessarily mean that the layer, the film, the region, the plate, etc., is directly on the something, but that another something may be interposed between the layer, the film, the region, the plate, or the other and the something. However, when a layer, a film, a region, a plate, etc. are disposed "directly on" something, no other thing is interposed between the layer, the film, the region, the plate, etc., and the something.

FIG. 1 is a schematic block diagram illustrating an OLED according to an embodiment of the invention. Referring to FIG. 1, an OLED includes a timing control section 10, a data driving section 20, a scan driving section 30, a power supplying section 40 and an organic light emitting panel 50.

The timing control section 10 receives an image signal DATA and control signal thereof provided from a graphic controller (not shown), preferably external, to generate first, second, and third timing signals TS1, TS2, and TS3. For example, the timing control section 10 provides the data driving section 20 with the image signal DATA and the first timing signal TS1, the scan driving section 30 with the second timing signal TS2, and the power supplying section 40 with the third timing signal TS3.

The data driving section 20 receives the image signal DATA and the first timing signal TS1 from the timing control section 10, and provides the organic light emitting panel 50 with data signals D1, D2, . . . , Dp, . . . , Dm.

The scan driving section 30 receives the second timing signal TS2 from the timing control section 10, and provides the organic light emitting panel 50 with scan signals S1, S2, . . . Sq, . . . , Sn, in sequence.

The power supplying section 40 receives the third timing signal TS3 from the timing control section 10, provides the scan driving section 30 with gate on/off voltages VON/VOFF, and provides the organic light emitting panel 50 with the common voltage VCOM and bias voltage VDD.

The organic light emitting panel 50 includes m-number of data lines DL, m-number of power supplying line VL, n-number of scan line SL, and an organic light emitting part EL formed in a region defined by two neighboring scan lines SL and two neighboring data lines DL.

For example, each of the data lines DL may extend in a substantially longitudinal direction. M-number of data lines DL may be arranged substantially in a lateral direction extending to the organic light emitting part EL. The data lines DL transfer the data signals D1, D2, . . . , Dp from the data driving section 20 to the organic light emitting parts EL.

Each of the power supplying lines VL may extend substantially in the longitudinal direction. M-number of the power supplying lines VL may be arranged substantially in the lateral direction extending to the organic light emitting part EL. The power supplying lines transfer first, second, and third bias voltages Vp, Vp+1, and Vp+2 from the power supplying section 40 to the organic light emitting part EL. The first, second, and third bias voltages Vp, Vp+1, and Vp+2 may be the same or different from each other.

Each of the scan lines SL may extend substantially in the lateral direction, e.g., substantially perpendicular to the data lines DL and the power supplying lines VL. N-number of the scan lines SL may be arranged substantially in the longitudinal direction extending to the organic light emitting part EL. The scan lines SL transfer scan signals S1, . . . Sq, Sq+1, . . . , Sn from the scan driving section 30 to the organic light emitting part EL.

The organic light emitting part EL includes a plurality of sub-pixels. For example, as shown in FIG. 1, there are six sub-pixels. The six sub pixels are a red (R) sub pixel, a green (G) sub pixel, a blue (B) sub pixel, a cyan (C) sub pixel, a magenta (M) sub pixel and a yellow (Y) sub pixel. Each of the sub pixels is adjusted according to the sub pixel having the lowest efficiency in order to obtain white color balance.

Since the OLED has lower luminance than a cathode ray tube display (CRT), an active driving method having a wide light emitting duty is used instead of a passive driving method. In the active driving method, light is emitted only when one of the scan lines is selected.

An OLED using the active driving method is referred to as an active matrix organic light emitting device (AMOLED). When a current density applied to an electroluminescent layer of a sub pixel increases, an amount of light emitted from the sub pixel increases. However, even when the same current is applied to the each sub-pixel, an amount of light emitted from each sub pixel is different.

Therefore, a size each sub pixel is adjusted according to the sub pixel having the lowest efficiency in order to obtain proper white color balance. For example, when the efficiencies of red, green and other colored sub pixels are about 2, 10 and 5, respectively, the efficiencies of the sub pixels are adjusted as shown in Table 1. That is, the value of the adjustment is "1" for the red sub pixel, "⅕" for the green sub pixel, and "⅖" for the other sub pixels.

TABLE 1

| | Efficiency before adjustment | Value of adjustment | Efficiency after adjustment |
|---|---|---|---|
| Red | 2 | 1 | 2 |
| Green | 10 | ⅕ | 2 |
| Blue | 5 | ⅖ | 2 |
| Cyan | 5 | ⅖ | 2 |
| Magenta | 5 | ⅖ | 2 |
| Yellow | 5 | ⅖ | 2 |

Figure 2:
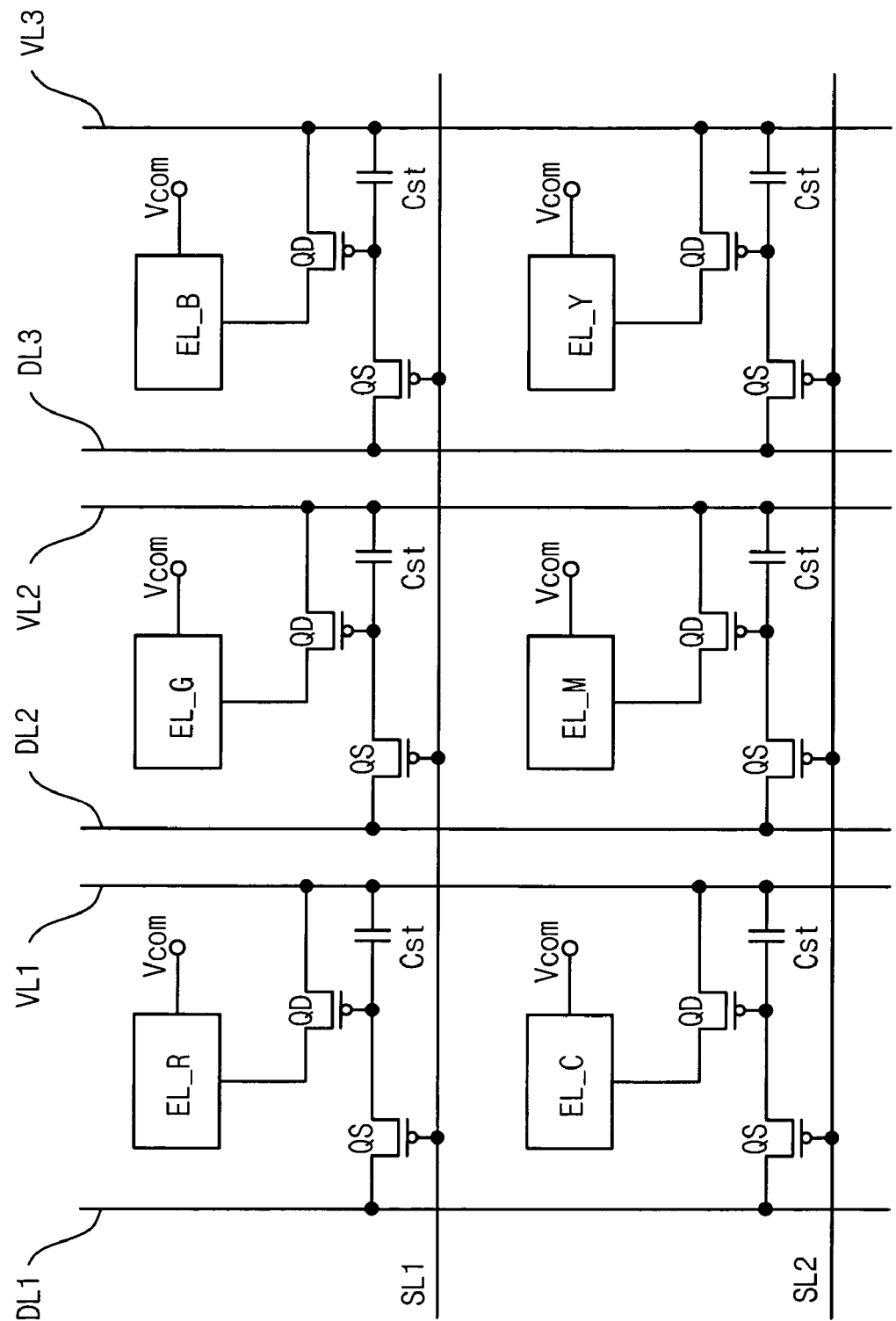
FIG. 2 is an equivalent circuit diagram of a display panel in FIG. 1.

FIG. 2 is an equivalent circuit diagram of the display panel shown in FIG. 1. The equivalent circuit diagram corresponds to a pixel including six sub pixels that display red, green, blue, cyan, magenta and yellow colors, respectively.

Referring to FIG. 2, according to an embodiment of the invention, a display panel includes a plurality of scan lines SL1 and SL2, a plurality of data lines DL1, DL2 and DL3, a plurality of power supplying lines VL1, VL2 and VL3, a plurality of light emitting devices EL_R, EL_G, EL_B, EL_C, EL_M and EL_Y and driver devices QS, QD and Cst. The light emitting devices EL_R, EL_G, EL_B, EL_C, EL_M and EL_Y are provided in a region defined by the scan lines SL1 and SL2 and the data lines DL1, DL2 and DL3. The driver devices QS, QD and Cst drive the light emitting devices EL_R, EL_G, EL_B, EL_C, EL_M and EL$_{13}$ Y.

The scan lines SL1 and SL2 extend substantially in a lateral direction and are also arranged substantially in a longitudinal direction extending to the light emitting part EL. The data lines DL1, DL2 and DL3 may extend substantially in the longitudinal direction and may also be arranged substantially in the lateral direction extending to the light emitting part EL. The power supplying lines VL1, VL2 and VL3 may extend substantially parallel with the data lines DL1, DL2 and DL3. The light emitting parts EL may be electrically connected or coupled with the power supplying lines VL1, VL2 and VL3.

The light emitting devices EL include a red sub pixel EL-R, a green sub pixel EL-G, a blue sub pixel EL-B, a cyan sub pixel EL-C, a magenta sub pixel EL-M, and a yellow sub pixel EL-Y. Each of the sub pixels EL-R, EL-G, EL-B, EL-C, EL-M and EL-Y is disposed in a region of the OLED defined by the scan lines SL1 and SL2 and data lines DL1, DL2 and DL3.

The driver devices QS, QD and Cst that drive the sub pixels EL-R, EL-G, EL-B, EL-C, EL-M and EL-Y are a switching transistor, a driver transistor and a storage capacitor, respectively. For example, the switching transistor QS and the driver transistor QD may be PMOS type transistors or NMOS type transistors.

In the PMOS transistor, polysilicon is generally used as a channel layer. However, in the NMOS transistor, amorphous silicon is generally used as the channel layer.

Figure 3:
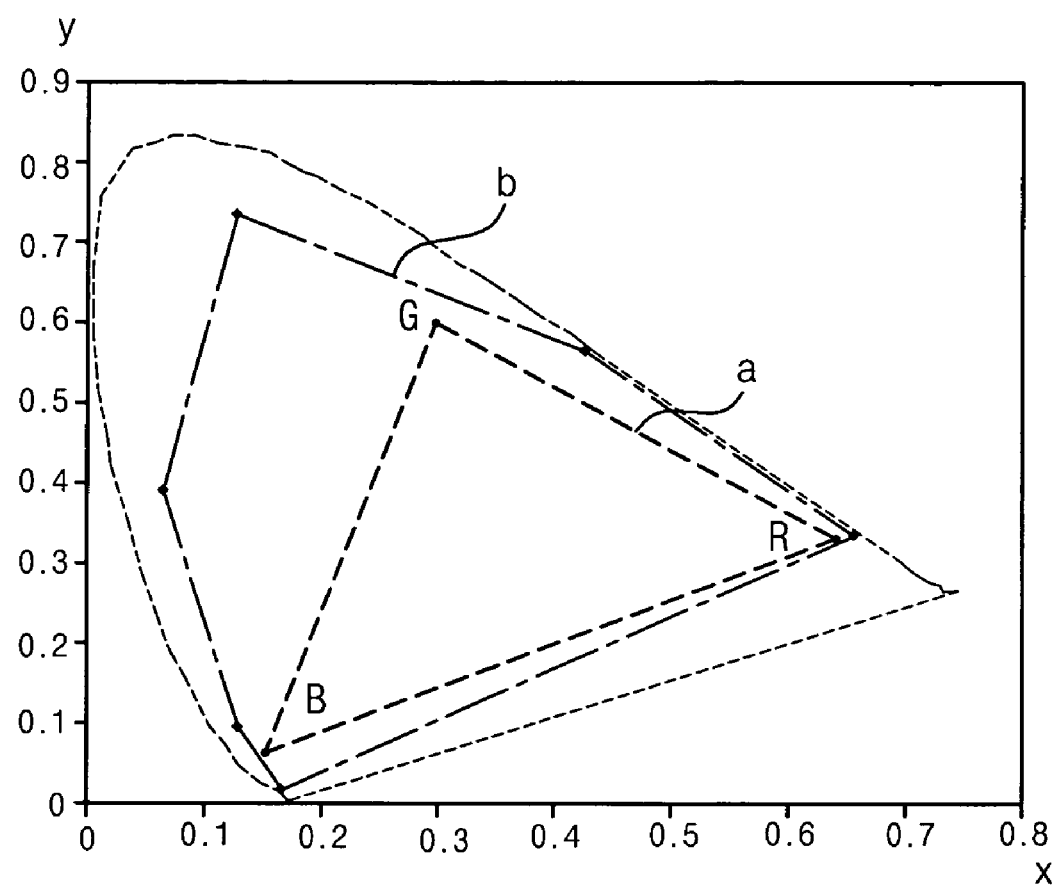
FIG. 3 is an extended CIE color coordinates according to an embodiment of the invention.

According to an embodiment of the invention, the display panel uses six colors as base colors, the colors including red, green, blue, cyan, magenta and yellow. Color reproductability is improved when a conventional three color base system of red, green and blue colors is extended to the six color base system of red, green, blue, cyan, magenta and yellow colors as shown in FIG. 3.

Hereinafter, 'R', 'G', 'B', 'C', 'M' and 'Y' represent red, green, blue, cyan, magenta and yellow, respectively.

A first sub pixel portion corresponding with the base colors RGB is disposed, for example, at an upper portion of FIG. 2 in that sequence. A second sub pixel portion corresponding with the complimentary colors CMY is disposed, for example, at a lower portion of FIG. 2 in that sequence. It is understood that the sequence of arrangement of the upper portion of FIG. 2 may be altered such as, RBG, BGR, BRG, etc., is used, and the sequence of arrangement of the lower portion of FIG. 2 may be altered such as, CYM, MYC, MCY, etc., is used. Further, the sub pixels of the base colors and the complementary colors may be alternately or randomly arranged.

In FIG. 2, the sub pixels are arranged, for example, in a 3 by 2 matrix shape. Alternatively, the sub pixels may be arranged in 6 by 1 matrix shape, 2 by 3 matrix shape, or 1 by 6 matrix shape.

FIG. 3 is an extended CIE color coordinates according to an embodiment of the invention.

Referring to FIG. 3, a region enclosed by a line 'a' corresponds to colors that may be generated by mixing the primary colors of red, green and blue lights with one another, and a region enclosed by a line 'b' corresponds to colors that may be generated by mixing the primary colors of red, green and blue lights and the complementary colors of cyan, magenta and yellow lights with one another.

As shown in FIG. 3, when the complementary colors are used together with the is primary colors, color range of display device increases.

The six color base system refers to a system shown below in Table 2, which is disclosed on page 50 of Billmeyer and Saltzman's "Principles of Color Technology", second edition, published by John Wiley & Sons, Inc.

TABLE 2

| | |
|---|---|
| Red | Red, Reddish-Orange |
| Green | Green |
| Blue | Blue, Purplish Blue, Bluish-Purple |
| Cyan | Bluish-Green, Blue-Green, Greenish Blue |
| Magenta | Red-Purple, Reddish-Purple, Purplish-Pink, Reddish-Purple, Purple |
| Yellow | Yellow, Orange, Yellowish-Orange, Greenish-Yellow, Yellow-Green |

Embodiments for white balancing by adjusting high efficiency color pixels on a basis of a lowest efficiency color pixel are discussed below.

Figure 4:
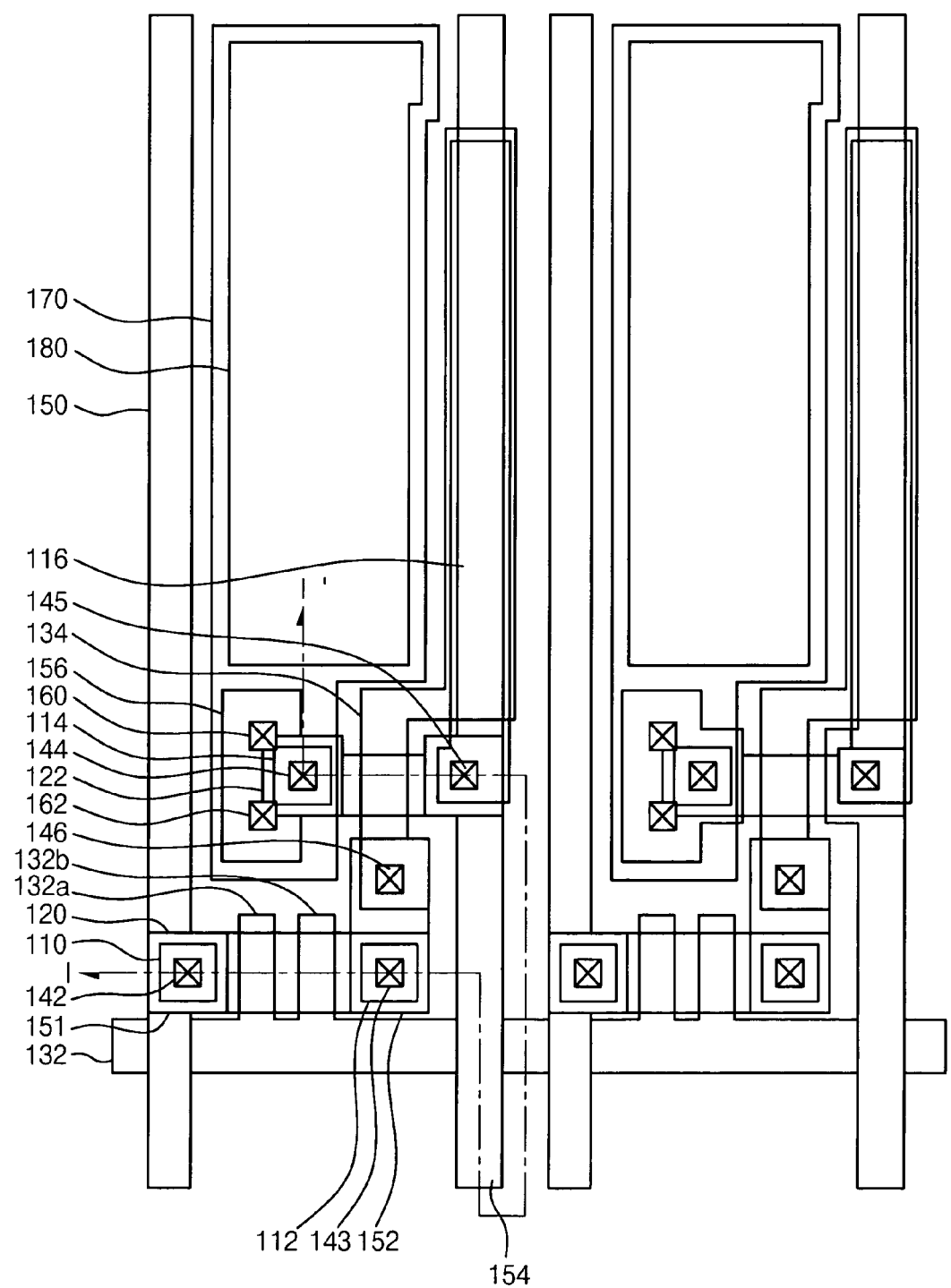
FIG. 4 is a layout illustrating a portion of an OLED according to a first embodiment of the invention.
Figure 5:
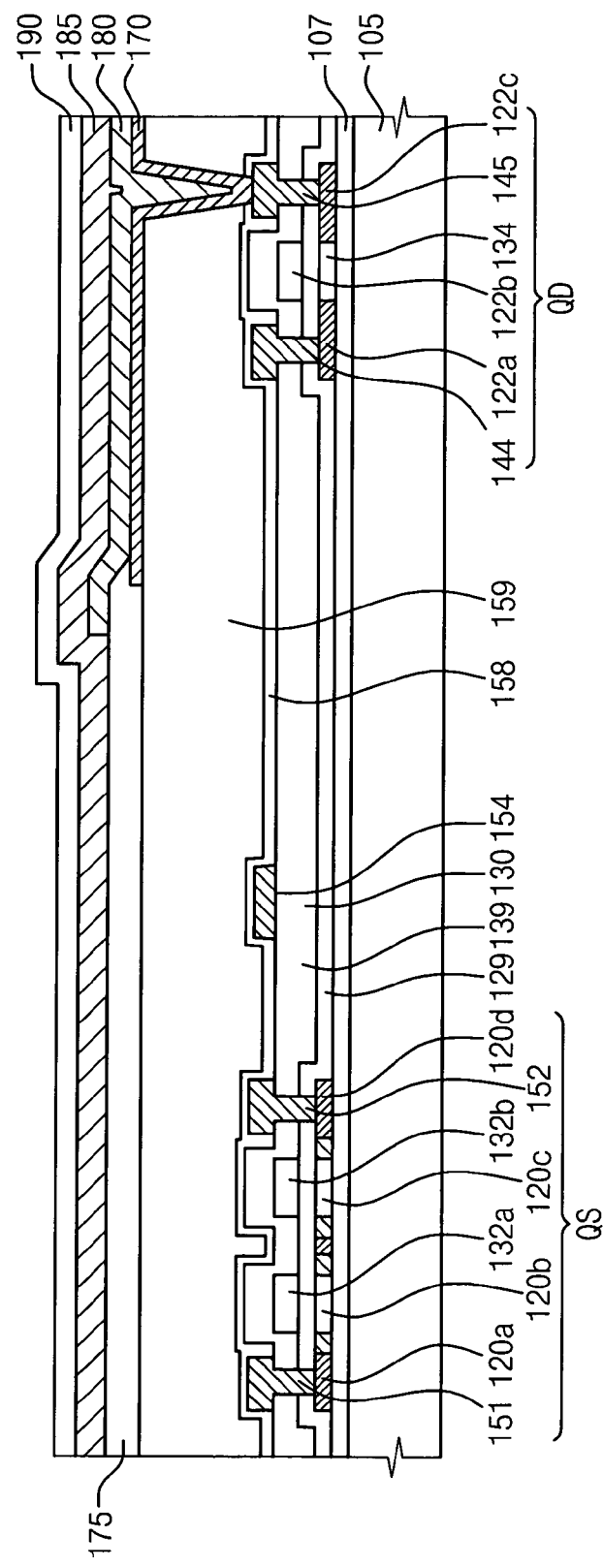
FIG. 5 is a cross-sectional view taken along the line I-I' in FIG. 4.

FIG. 4 is a layout illustrating a portion of an OLED according to a first embodiment of the invention. FIG. 5 is a cross-sectional view taken along the line I-I' in FIG. 4. The OLED of the present embodiment has different size driver transistors.

Referring to FIG. 4, an OLED according to the present embodiment includes a scan line 132, a data line 150, a power supplying line (VDD) 154 and driver transistors. Neighboring driver transistors may have a different size from each other.

Referring to FIG. 4 and FIG. 5, an insulation layer 107 is formed on a substrate 105. The substrate 105 may be optically transparent. The substrate 105 may include a glass substrate, quartz substrate, glass ceramic substrate and crystallized glass substrate, etc. Preferably, the substrate is made of a material having a heat resisting property.

The insulation layer 107 is efficient for a substrate including ions moving in the substrate, or a substrate that is electrically conductive. When the substrate is a quartz substrate, the insulation layer 107 is not required. The insulation layer 107 may include silicon. The insulation layer including silicon may further include oxygen (O), nitrogen (N), or both by specific ratio, which is preferable. The insulation layer 107 may be silicon oxide layer, silicon nitride layer, silicon oxide nitride ($SiO_xN_y$, wherein x and y are integers), etc.

A switching transistor QS is formed on the insulation layer 107. The switching transistor QS includes a first active layer, a gate insulation layer 129, first gate electrodes 132a and 132b, a first dielectric layer 139, a first source electrode 151, and a first drain electrode 152.

The first active layer includes a first source region 120a, first channel layers 120b and 120c, and a first drain region 120d.

The gate insulation layer 129 is formed on the first active layer and exposes the first source region 120a and the first drain region 120d. The first gate electrodes 132a and 132b are formed on the gate insulation layer 129.

The first dielectric layer 139 is formed on the first gate electrodes 132a and 132b and the gate insulation layer 129 and exposes the first source region 120a and the first drain region 120d.

The first source electrode 151 is formed on the first dielectric layer 139 and is electrically coupled with the first source region 120a.

The first drain electrode 152 is formed on the first dielectric layer 139 and is electrically coupled with the first drain region 120d.

In FIG. 4 and FIG. 5, the first gate electrode 152 has, for example, a double gate structure. Alternatively, the first gate electrode 152 may have a single gate structure or a multi gate structure having more than two gates.

A power supplying line 144 that applies bias currents is formed on the first dielectric layer 139.

The driver transistor QD is formed on the insulation layer 107 and controls current. The driver transistor QD includes a second active layer, a gate insulation layer 129, a second gate electrode 134, a first dielectric layer 139, a second source electrode 144 and a second drain electrode 145.

The second active layer includes a second source region 122a, a second channel layer 122b and a second drain region 122c.

The gate insulation layer 129 is formed on the second active layer and exposes the second source region 122a and the second drain region 122c.

The second gate electrode 134 is formed on the gate insulation layer 129.

The first dielectric layer 139 is formed on the second gate electrode 134 and the gate insulation layer 129 and exposes the second source region 122a and the second drain region 122c.

The second source electrode 144 is formed on the first dielectric layer 139 and is electrically coupled with the second source region 122a.

The second drain electrode 145 is formed on the first dielectric layer 139 and is electrically coupled with the second drain region 122c.

As shown in FIG. 4 and FIG. 5, the second gate electrode 134 has, for example, a double gate structure. Alternatively, the second gate electrode 134 may have a single gate structure or a multi gate structure having more than two gates.

A second dielectric layer 158 may be formed on the driver transistor QD, the power supplying line 154 and the switching transistor QS. A leveling layer 159 may be formed on the second dielectric layer 158.

A pixel electrode layer 170 is electrically coupled with the drain electrode 145 of the driver transistor QD via a hole passing through the leveling layer 159 and the second dielectric layer 158.

A partition 175 is formed on the pixel electrode layer 170, which defines a light emitting region of a sub pixel. An EL layer 180 is formed mostly in at least a region where the partition 175 is not formed. An opposite electrode 185 is formed on or covers the EL layer 180 and the partition 175. A protection layer 190 is formed on or covers the opposite electrode 185.

When the EL layer 180 has a multi-layered structure, light emitting efficiency may be greater. Generally, the EL layer 180 includes a hole injected layer, a hole transporting layer, a light emitting layer and an electron transporting layer. The hole injected layer may be formed on the pixel electrode layer 170, the hole transporting layer may be formed on the hole injected layer, the light emitting layer may be formed on the hole transporting layer, and the electron transporting layer is formed on the light emitting layer.

The EL layer 180 may include the hole-transporting layer, the light emitting layer, and the electron-transporting layer stacked in that order. Alternatively, the EL layer 180 may include the hole injected layer, the hole transporting layer, the light emitting layer, the electron transporting layer and an electron injected layer stacked in that order.

According to an embodiment of the invention, when an OLED is an independent bottom light emitting type OLED, the EL layer 180 may emit one of the red, green, blue, cyan, magenta and yellow lights, and the opposite electrode 185 may comprise metal. When the pixel electrode 170 is an anode, the opposite electrode is a cathode, and vice versa.

According to an embodiment of the invention, when an OLED is an independent top light emitting type OLED, the EL layer 180 may emit one of the red, green, blue, cyan, magenta and yellow lights, and the opposite electrode 185 may comprise an optically transparent and electrically conductive material, such as indium tin oxide (ITO).

When the OLED has a color filter and is a bottom light emitting type OLED, the OLED may further include one of color filters of red, green, blue, cyan, magenta and yellow, and the opposite electrode 185 may includes metal.

When the OLED has a color filter and is a top light emitting type OLED, the OLED may further include one of color filters of red, green, blue, cyan, magenta and yellow, and the opposite electrode 185 may include an optically transparent and electrically conductive material such as indium tin oxide (ITO).

In FIG. 4 and FIG. 5, the OLED is a bottom light emitting type OLED and the power supplying line VDD is additionally formed. A region where the power supplying line VDD is formed is a non-light emitting region to reduce an area of a light emitting region. When the OLED is a top light emitting type OLED, the power supplying line VDD is formed under a light emitting layer. Therefore, an area of the light emitting region is not reduced.

As described above, to adjust light emitting according to the sub pixel having the lowest light emitting efficiency, each driver transistor is formed having a different size from one to another.

For purposes of convenience, a pixel formed at a left side of the OLED is referred to as a first sub pixel and a pixel formed at a right side of the OLED is referred to as a second sub pixel.

When a light emitting efficiency of the first sub pixel is greater than a light emitting efficiency of the second sub pixel, the driver transistor that drives the first sub pixel is adjusted in size according to a size of the driver transistor that drives the second sub pixel. For example, the size of the driver transistor that drives the first sub pixel is reduced to be smaller than the size of the driver transistor that drives the second sub pixel.

Figure 6:
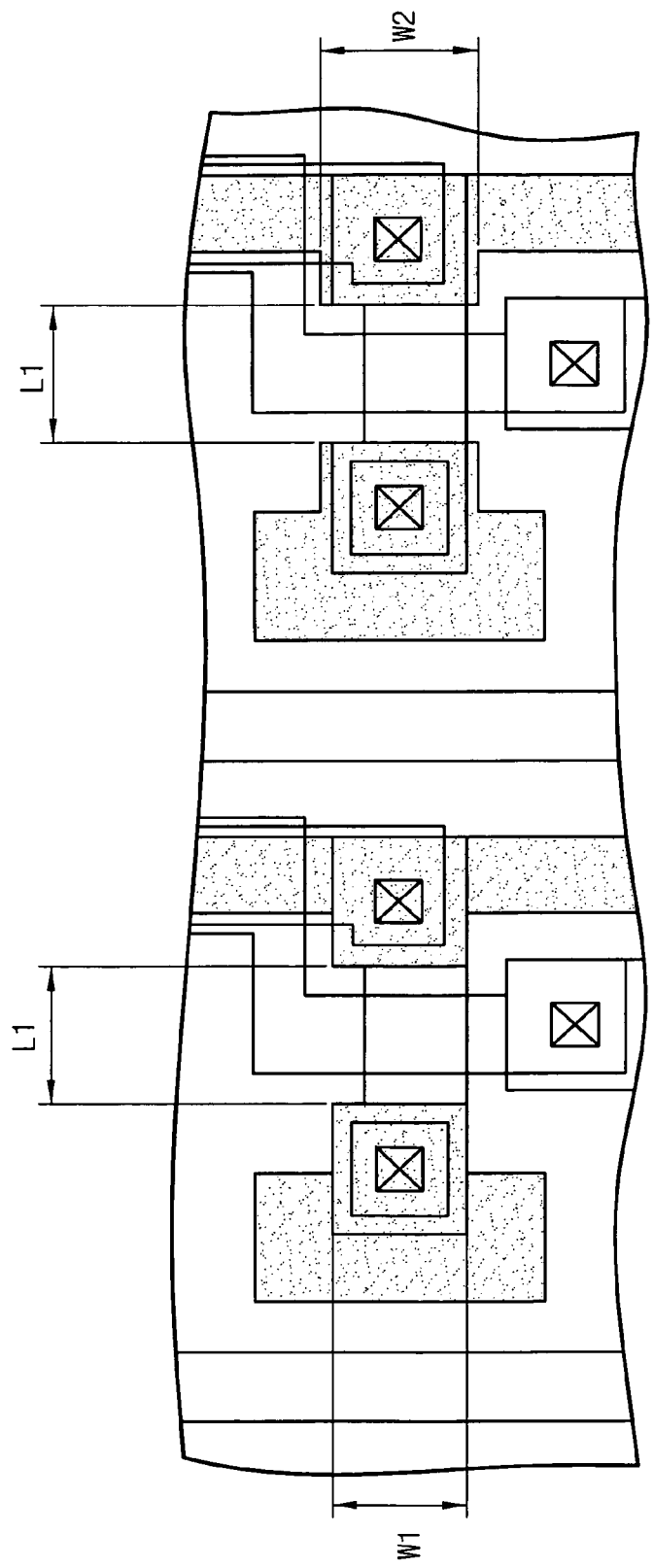
FIG. 6 is a layout illustrating a driver transistors having different sizes according to an embodiment of the invention.

FIG. 6 is a layout illustrating driver transistors having different size from one another according to the present invention.

Referring to FIG. 6, first and second sub pixels have a same channel length L1 but a different channel width. A channel width of the first sub channel is adjusted on a basis of a channel width of the second sub channel. In detail, as shown in FIG. 6, the second sub channel has a second channel width W2 and the first sub channel has a first channel width W1 that is smaller than the second channel width W2.

A size of a transistor is defined by W/L, so that when a length L becomes smaller and a width W becomes larger, the defined size of the transistor becomes larger. Therefore, by adjusting the length L or the width W, the size of the transistor may be adjusted.

Therefore, a size of the second pattern formed in neighboring sub pixels, which forms a drain electrode of the driver transistor QD, may be different from each another. When the second pattern is reduced or enlarged, patterns protruding from the power supplying line 154 are also reduced or enlarged.

FIGS. 7, 8, 9, 10, 11, 12, 13, and 14 are plan views illustrating a process of manufacturing the OLED shown in FIG. 4.

Figure 7:
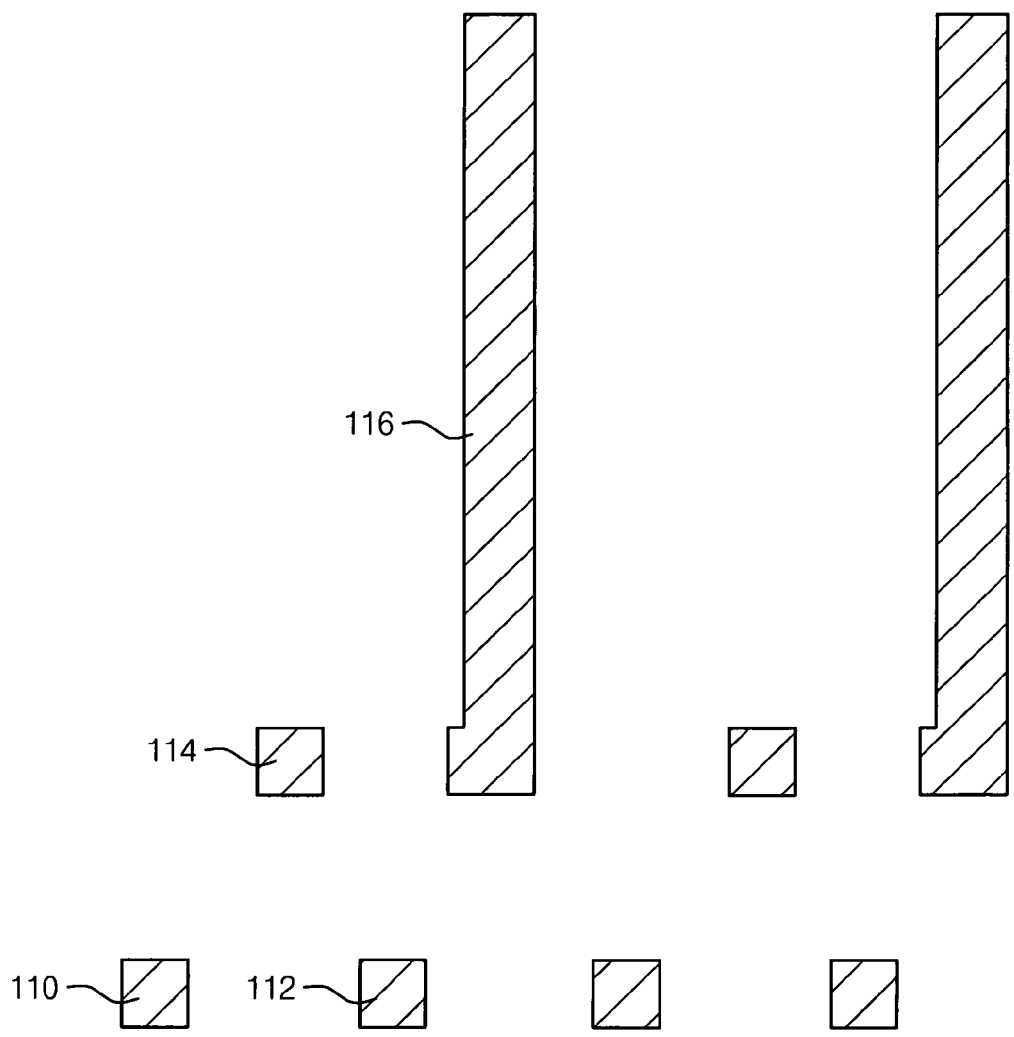
FIGS. 7, 8, 9, 10, 11, 12, 13, and 14 are plan views illustrating a process of manufacturing the OLED shown in FIG. 4.

Referring to FIG. 7, a first buffer layer 110 for forming a source electrode of a switching transistor QS, a second buffer layer 112 for forming a drain electrode of the switching transistor QS, a third buffer layer 114 for forming a drain electrode of a driver transistor QD and a fourth buffer layer 116 for forming a source electrode of the driver transistor QD are formed on an insulation layer (not shown) that is formed on a substrate (not shown).

Figure 8:
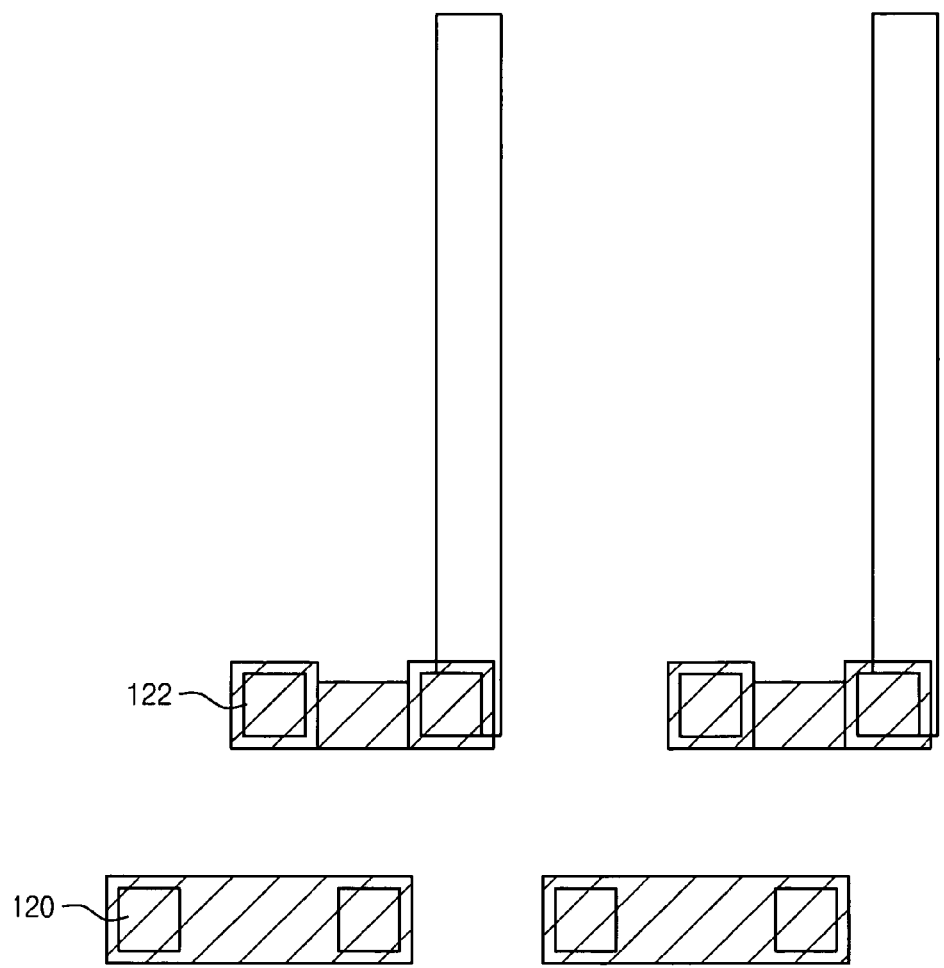

Referring to FIG. 8, a first active layer 120 for forming the switching transistor QS and a second active layer 122 for forming the driver transistor QD controlling current are formed on the insulation layer having the first, second, third and fourth buffer layers 110, 112, 114 and 116 formed thereon. The first and second active layers 120 and 122 include a source region, a channel region and a drain region.

Figure 9:
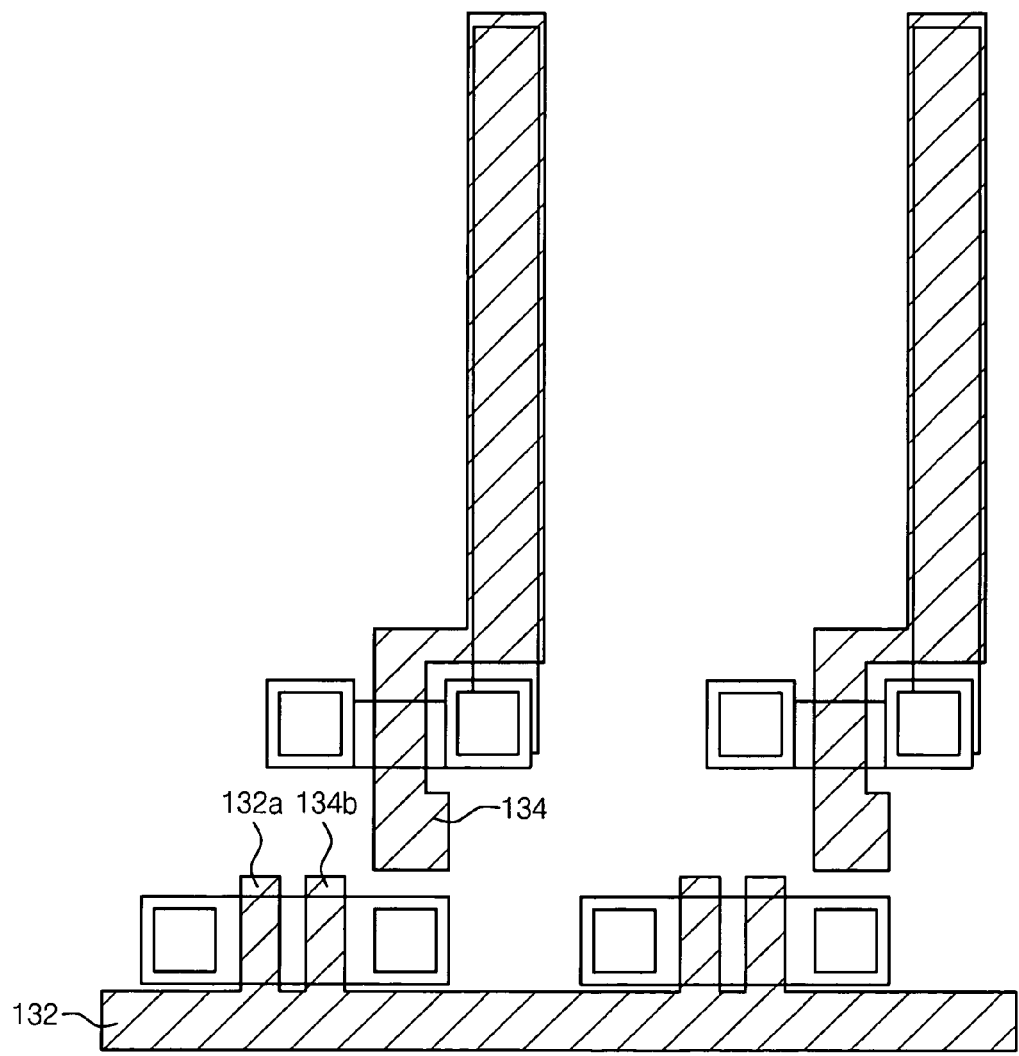

Referring to FIG. 9, a metal layer is formed on the substrate having the first active layer 120 and the second active layer 122 formed thereon. The metal layer is patterned to form a scan line 132 extending in a substantially lateral direction, a storage capacitor line 134 extended in a substantially longitudinal direction, e.g., substantially opposite to the scan line 132, and gate electrodes 132a and 132b protruding or extending from the scan line 132. In FIG. 9, two gate electrodes 132a and 132b for a double gate type OLED are shown; however, it is understood that only one gate electrode for a single gate type OLED may be formed, or more gate electrodes than two.

Figure 10:
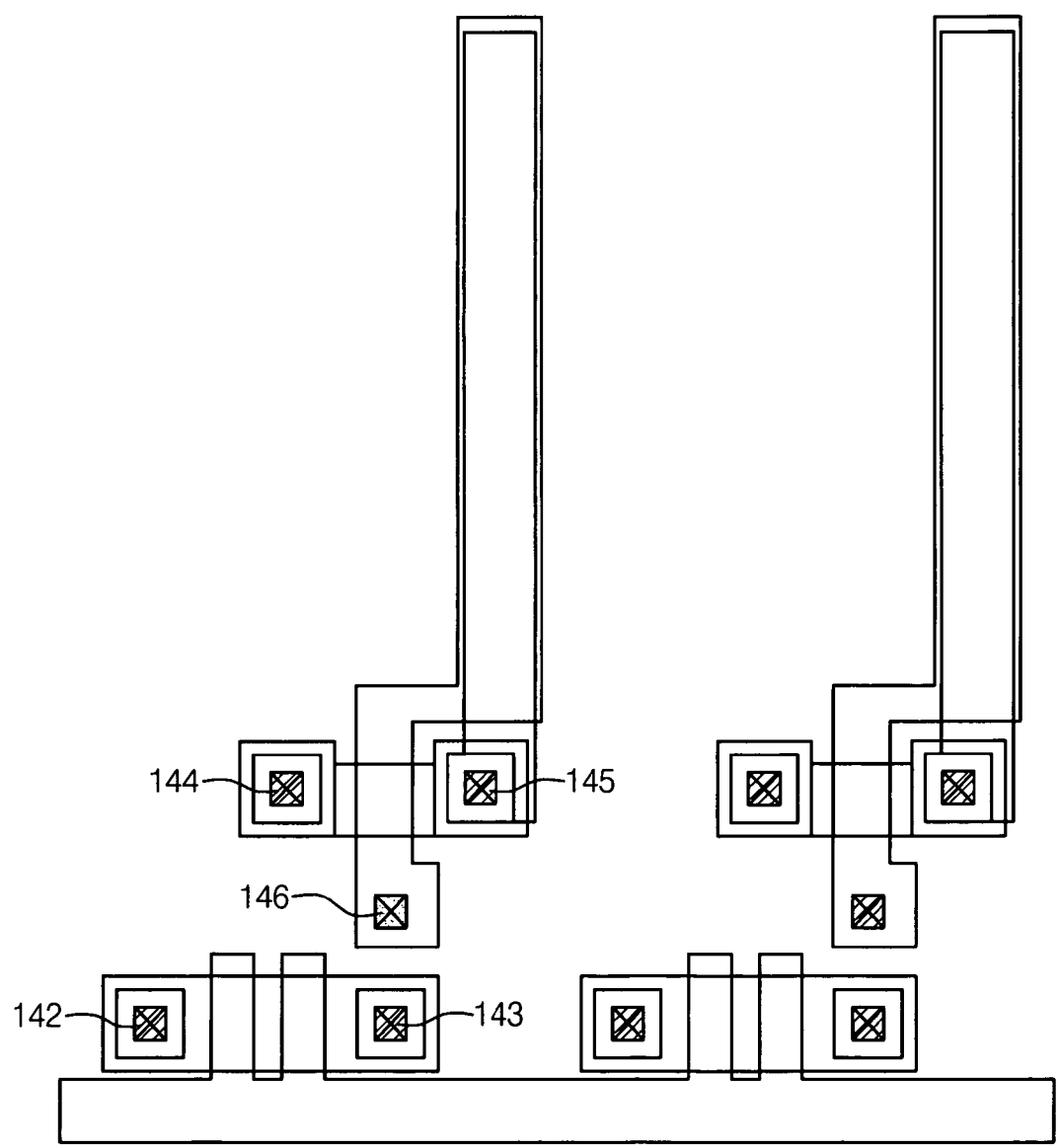

Referring to FIG. 10, first contact holes 142 and 143 are formed at each end portion of the first active layer 120. Second contact holes 144 and 145 are formed at each end portion of the second active layer 122. A source electrode and a drain electrode of the switching transistor QS that is to be formed are electrically coupled with the first active layer 120 via the first contact holes 142 and 143. A source and a drain electrode of the driver transistor QD that is to be formed are electrically coupled with the second active layer 122 via the second contact holes 144 and 145.

Figure 11:
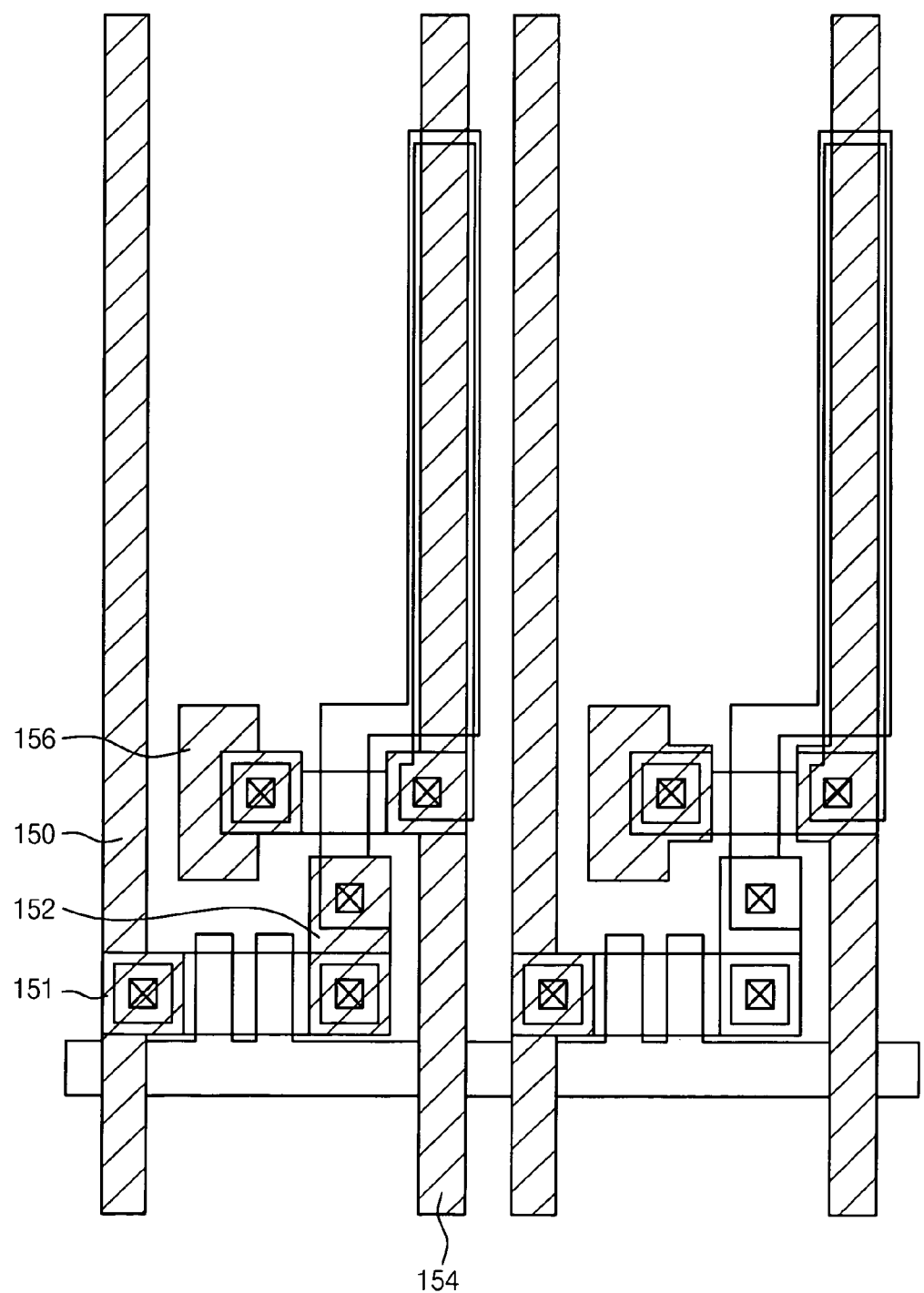

Referring to FIG. 11, a data line 150 extending in substantially a longitudinal direction, a source electrode 151 protruding or extending from the data line 150 and electrically coupled with the first active layer via the first contact hole 142, a first pattern 152 spaced apart from the source electrode 151, a power supplying line 154 extending in the substantially longitudinal direction, and a second pattern 156 are formed. The first pattern 152 and the second pattern 156 are for a drain electrode of the switching transistor QS and a drain electrode of the driver transistor QD, respectively.

Figure 12:
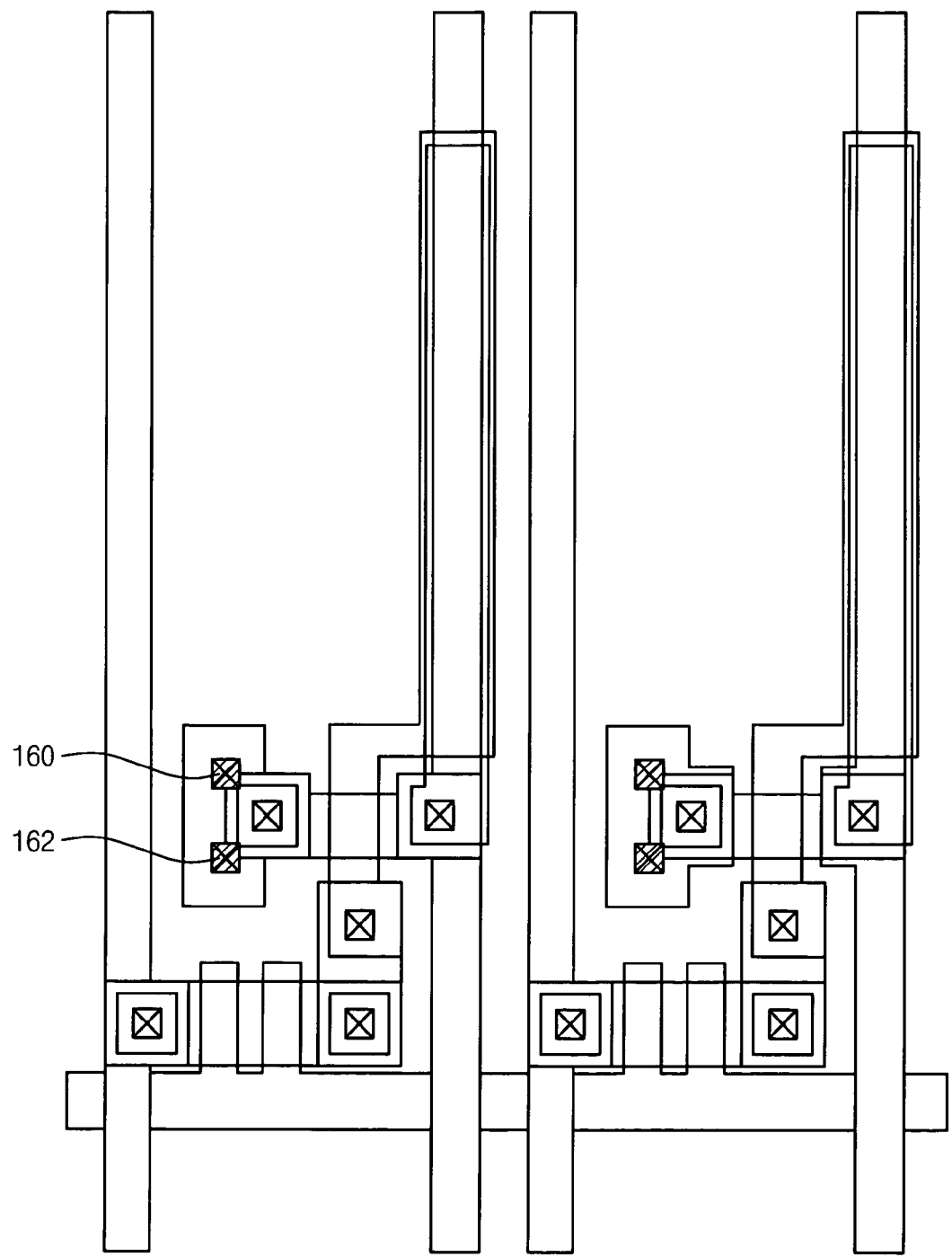

Referring to FIG. 12, third contact holes 160 and 162 are formed to the drain electrode of the driver transistor QD with a pixel electrode.

Figure 13:
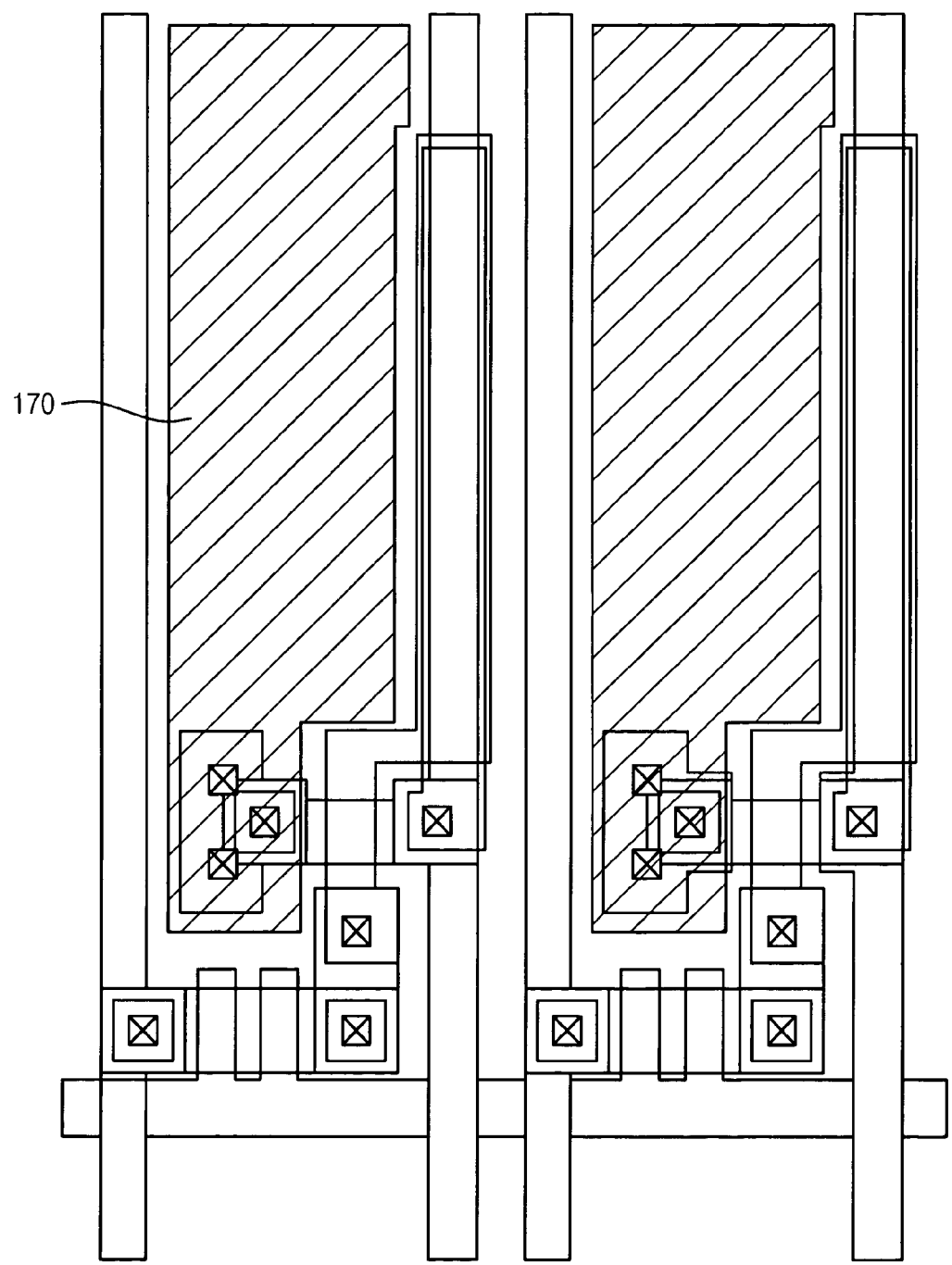

Referring to FIG. 13, the pixel electrode is formed, preferably being an indium tin oxide (ITO) layer 170. The ITO layer 170 is electrically coupled with the drain electrode of the driver transistor QD through the third contact holes 160 and 162. The ITO layer 170 may be formed having a specific shape defined by a mask, as described in FIG. 13. Alternatively, the ITO layer 170 may cover the entire surface of the substrate, and then be patterned to have a particular shape.

Figure 14:
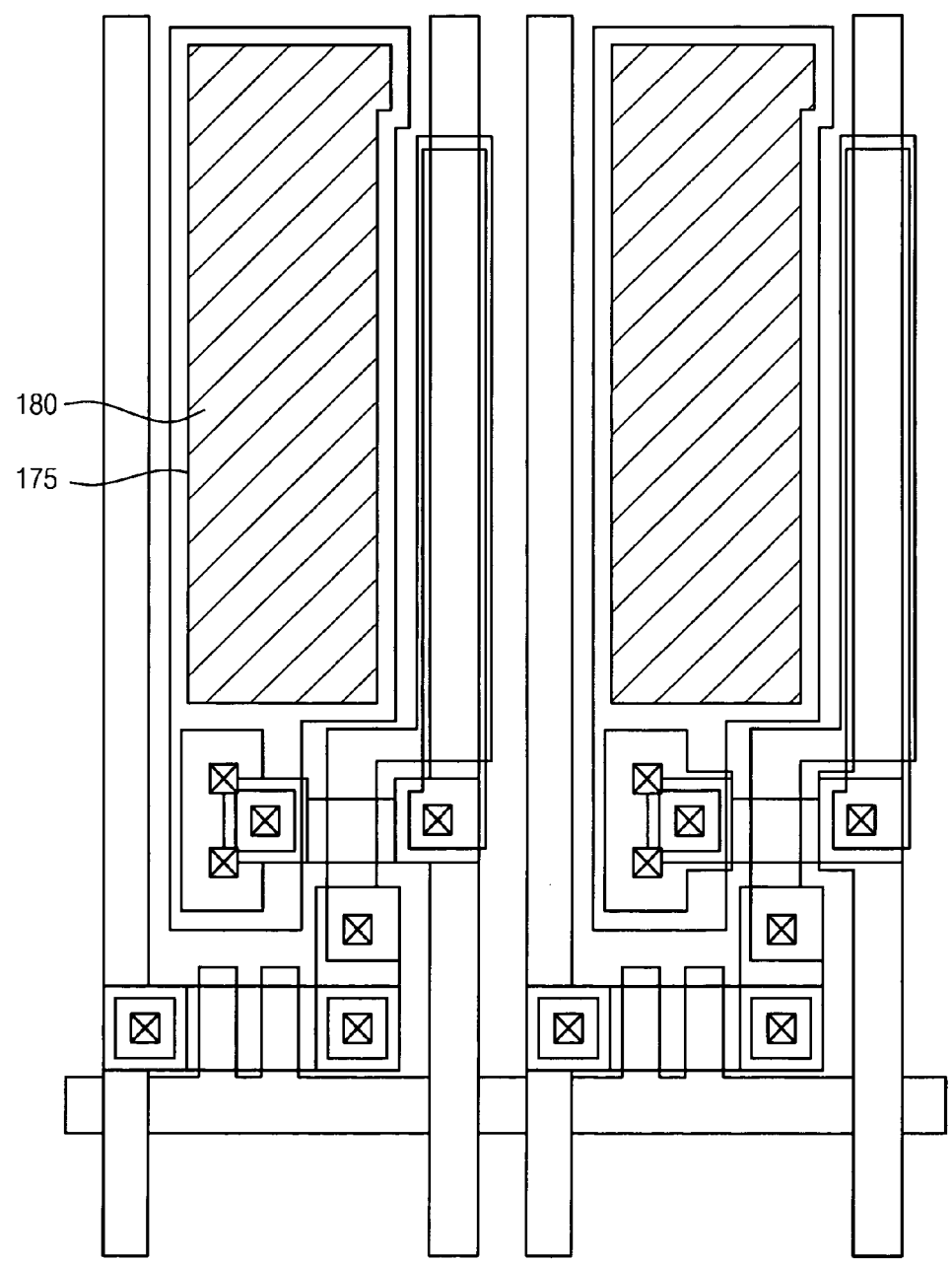

Referring to FIG. 14, a partition 175 for defining a light emitting region and unit sub pixel is formed. The partition 175 may receive an organic light emitting layer that is to be formed.

Referring again to FIG. 4 and FIG. 5, the EL layer 180 may be formed mostly in the region where the partition is not formed. The opposite electrode 185 is formed on the EL layer 180 and the partition 175. The protection layer 190 is formed on the opposite electrode 185.

A process of forming the switching transistor QS and the driver transistor QD of polysilicon type is described below. Alternatively, the switching transistor QS and the driver transistor QD of amorphous silicon type may be used.

As described above, white color balance may be adjusted or controlled by adjusting a size of driver transistor of sub pixel formed in OLED panel. For example, a size of the driver transistors may be adjusted according to a size of a driver transistor having lowest light emitting efficiency.

Figure 15:
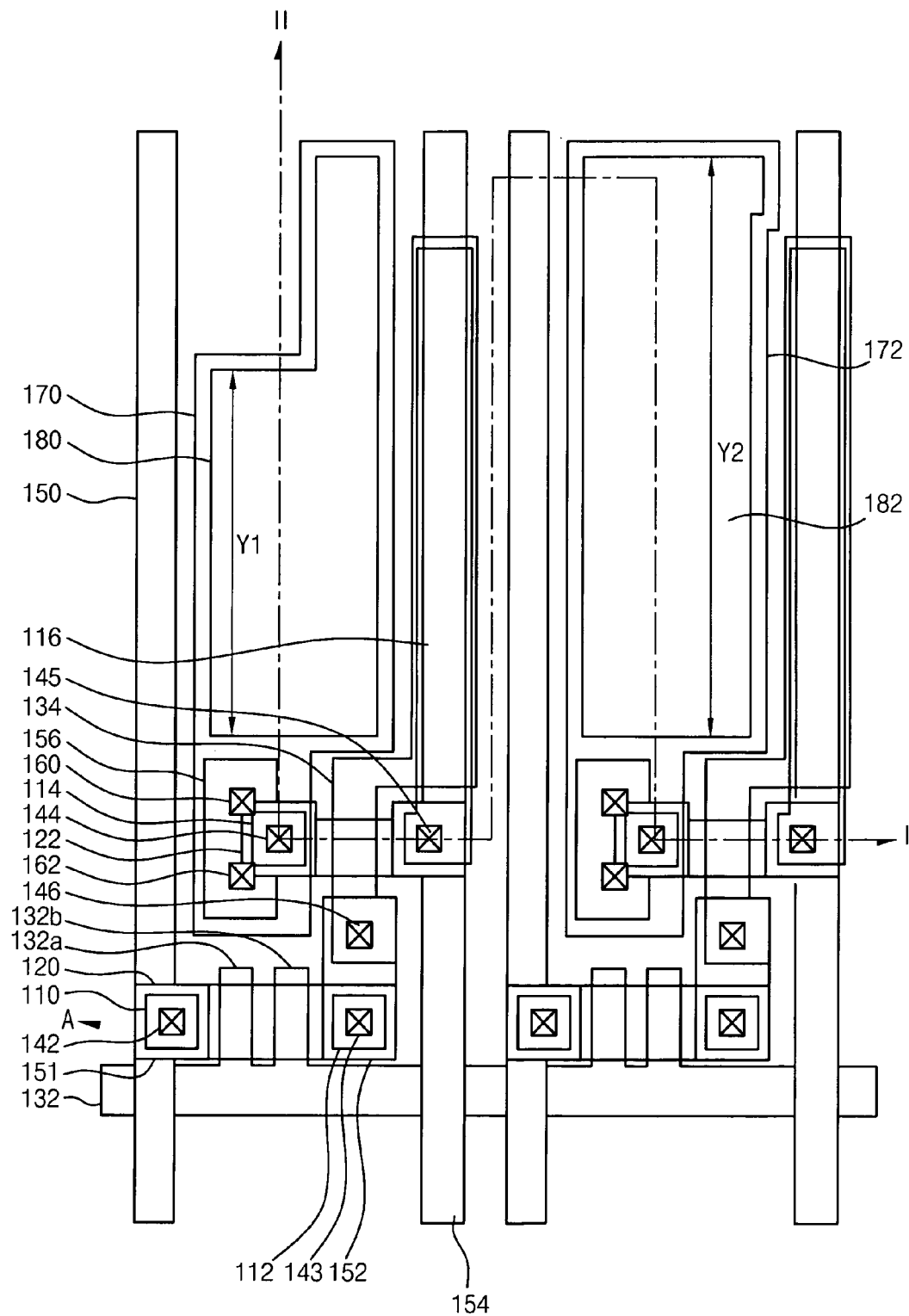
FIG. 15 is a layout illustrating a portion of an OLED according to a second embodiment of the invention.
Figure 16:
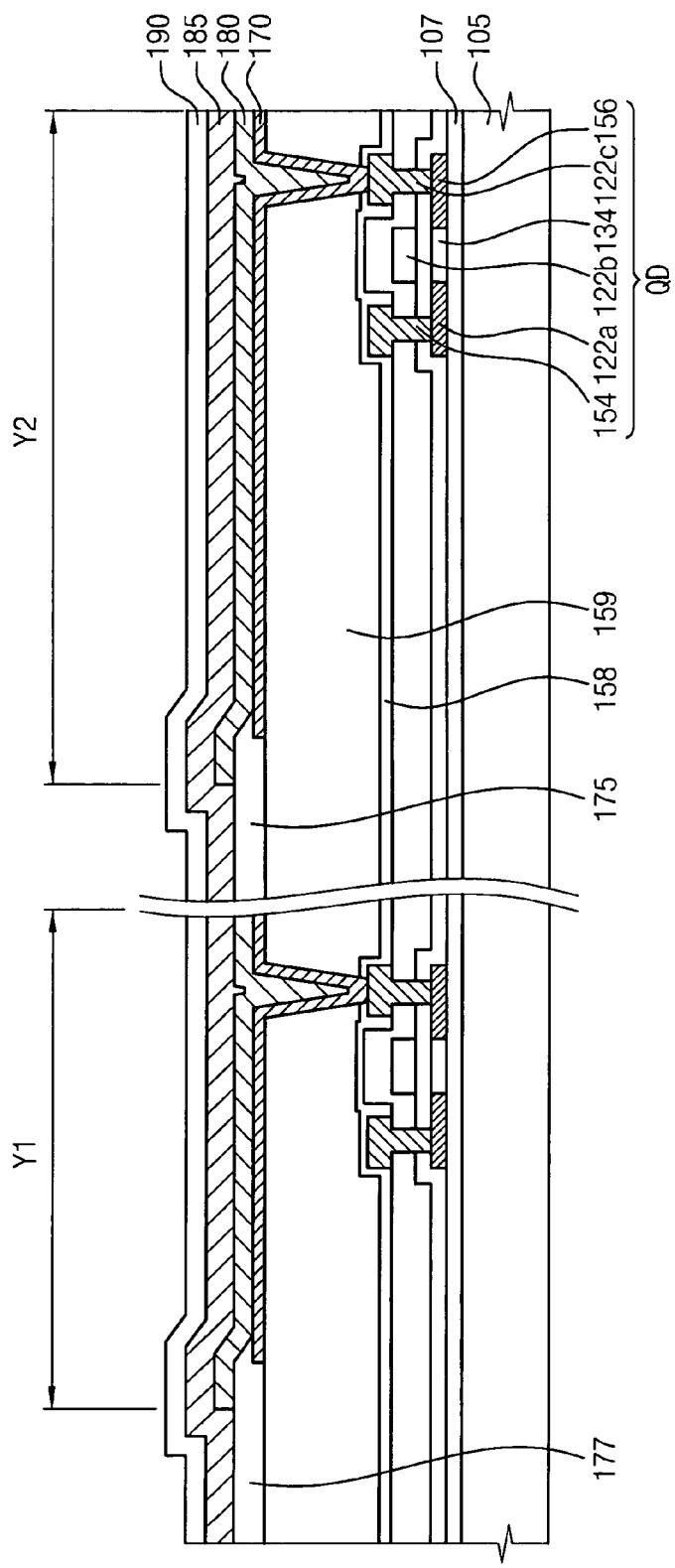
FIG. 16 is a cross-sectional view taken along the line II-II' in FIG. 15.

FIG. 15 is a layout illustrating a portion of an OLED according to a second exemplary embodiment of the invention. FIG. 16 is a cross-sectional view taken along the line II-II' in FIG. 15. FIG. 15 and FIG. 16 show an OLED panel having light emitting region with different size from one another. The same reference numerals refer to the same or similar parts as those described above and any further explanation are omitted as necessary.

For purposes of convenience, a pixel formed at a left side of the OLED is referred to as a first sub pixel and a pixel formed at a right side of the OLED is referred to as a second sub pixel.

When a light emitting efficiency of the first sub pixel is greater than a light emitting efficiency of the second sub pixel, a size of the first sub pixel is adjusted according to a size of the second sub pixel. For example, an area of a light emitting region of the first sub pixel is reduced to be smaller than an area of a light emitting region of the second sub pixel. Hereinafter, 'area of a light emitting region' refers to an area of a light emitting layer or an area of a portion of the light emitting layer that is exposed and not covered by a partition.

Referring to FIG. 15 and FIG. 16, a first partition 175 defining a first light emitting region having a first size is formed near a first pixel electrode layer 170 corresponding to a first sub pixel. A second partition 177 defining a second light emitting region having a second size that may be larger than the first size is formed near a second pixel electrode layer 172 corresponding to a first sub pixel.

For example, an area of a neighboring light emitting region defined by the partitions is adjusted according to an area of the light emitting region having the lowest light emitting efficiency.

An EL layer 180 is then formed mostly on a region where no partitions are formed. An opposite electrode 185 is formed on the EL layer 180 and the first and second partitions 175 and 177, and a protection layer 190 is formed on the opposite electrode 185.

When the EL layer 180 has a stack-like structure, light emitting efficiency is enhanced. In general, the EL layer 180 may include a hole injected layer formed on the pixel electrode 170, a hole transferring layer formed on the hole injected layer, a light emitting layer formed on the hole transferring layer, and an electron transferring layer formed on the light emitting layer. Alternatively, the EL layer 180 may include a hole transferring layer, a light emitting layer and an electron transferring layer mounted in that sequence or the EL layer 180 may include a hole injected layer, a hole transferring layer, a light emitting layer, an electron transferring layer and an electron injected layer mounted in that sequence.

When an OLED according to an embodiment of the invention is an independent and bottom light emitting type OLED, the EL layer 180 may emit one of the red, green, blue, cyan, magenta and yellow lights, and the opposite electrode 185 may comprise metal. When the pixel electrode 170 is an anode, the opposite electrode is a cathode, and vice versa.

When an OLED according to an embodiment of the invention is an independent and top light emitting type OLED, the EL layer 180 may emit one of the red, green, blue, cyan, magenta and yellow lights, and the opposite electrode 185 may comprise optically transparent and electrically conductive material, such as indium tin oxide (ITO).

When the OLED has a color filter and is a bottom light emitting type OLED, the OLED may further include one of color filters of red, green, blue, cyan, magenta and yellow, and the opposite electrode 185 may include metal.

When the OLED has a color filter and is a top light emitting type OLED, the OLED further includes one of color filters of red, green, blue, cyan, magenta and yellow, and the opposite electrode 185 may include an optically transparent and electrically conductive material, such as indium tin oxide (ITO).

It is understood that the size of the light emitting region may be adjusted. Alternatively, a thickness of the light emitting layer may be adjusted to obtain white color balance since an amount of light per unit area increases as a thickness of the light emitting layer increases.

As previously described, white color balance may be charged by adjusting a size of the light emitting region of sub pixel formed in OLED panel. For example, a size of the light emitting region may be adjusted according to a size of a driver transistor having the lowest light emitting efficiency.

Figure 17:
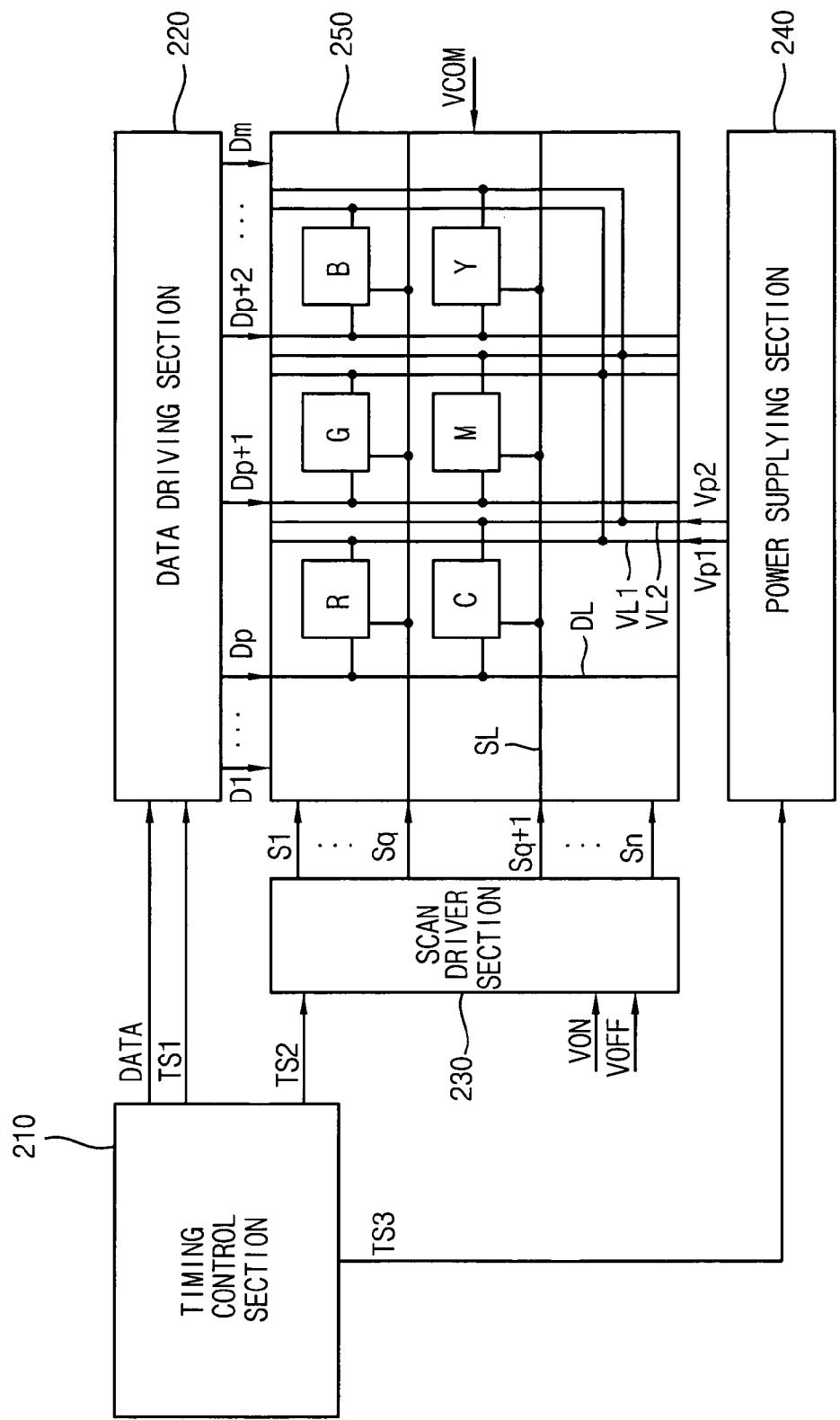
FIG. 17 is a schematic block diagram illustrating an OLED according to a third embodiment of the invention.

FIG. 17 is a schematic block diagram illustrating an OLED according to a third embodiment of the invention. In a non-limiting embodiment, the OLED includes pixels arranged in a three by two matrix shape and applied with bias voltages of different magnitude.

Referring to FIG. 17, the OLED includes a timing control section 210, a data driving section 220, a scan driving section 230, a power supplying section 240, and an organic light emitting panel 250.

The timing control section 210 receives an image signal DATA and control signal from an external graphic controller (not shown) to generate first, second and third timing signals TS1, TS2 and TS3. The timing control section 210 provides the data driving section 220 with the image signal DATA and the first timing signal TS1. The timing control section 210 provides the scan driving section 230 with the second timing signal TS2. The timing control section 210 provides the power supplying section 240 with the third timing signal TS3.

The data driving section 220 receives the image signal DATA and the first timing signal TS1 from the timing control section 210 provides the organic light emitting panel 250 with data signals D1, D2, . . . , Dp, . . . , Dm.

The scan driving section 230 receives the second timing signal TS2 from the timing control section 210 and sequentially provides the organic light emitting panel 250 with scan signals S1, S2, . . . Sq, . . . , Sn.

The power supplying section 240 receives the third timing signal TS3 from the timing control section 210 and provides the scan driving section 230 with gate on/off voltages VON/VOFF. The power supplying section 240 also provides the organic light emitting panel 250 with the common voltage VCOM, bias voltage and first and second bias voltages Vp1 and Vp2.

Figure 18A:
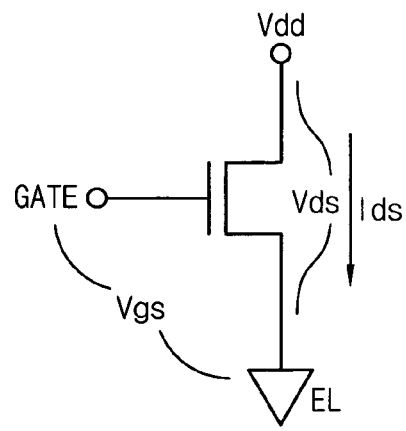
FIG. 18A is a schematic diagram illustrating a switching device that provides organic light emitting part with current.
Figure 18B:
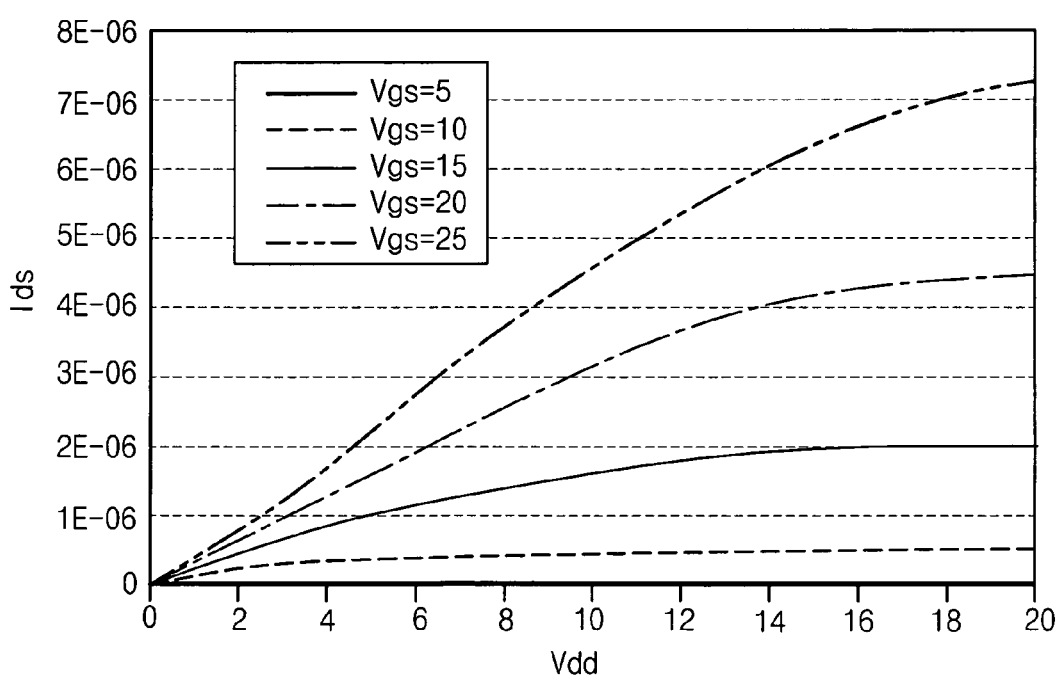
FIG. 18B is a graph illustrating a relationship between a bias voltage and a current that flow through gate and source electrodes of the switching device.

FIG. 18A is a schematic diagram illustrating a switching device providing an organic light emitting part with current. FIG. 18B is a graph illustrating a relationship between a bias voltage and a current both of which flow through gate and source electrodes of the switching device.

Referring to FIG. 18A and FIG. 18B, when a voltage Vgs corresponding to a voltage difference between gate and source electrodes is approximately 5V, current Ids flowing between the drain electrode and the source electrode is approximately 0A, even when a bias voltage Vdd is applied. When the voltage Vgs is approximately 15V, the current Ids increases as the bias voltages Vdd increase and the current Ids is saturated to approximately 2 μA.

When the voltage Vgs is approximately 20V, the current Ids increases as the bias voltages Vdd increases. The current Ids reaches approximately 3 μA when the bias voltage Vdd is approximately 10V, and the current Ids reaches approximately 4 μA when the bias voltage Vdd is approximately 15V.

As shown above, the light emitting efficiency may be modified by changing the bias voltage Vdd applied to switching device.

Referring again to FIG. 17, the organic light emitting panel 250 includes m-number of data lines DL, m-number of first power supplying lines VL1, m-number of second power supplying lines VL2, n-number of scan lines SL and organic light emitting parts EL formed in a region defined by two neighboring scan lines SL and two neighboring data lines DL.

Each of the data lines DL extends in a substantially longitudinal direction, and m-number of data lines DL are arranged in a substantially lateral direction, e.g., opposite direction as the data lines DL. The data lines DL transfer the data signals D1, D2, . . . , Dp from the data driving section 220 to the organic light emitting parts EL.

Each of the first power supplying lines VL1 extends in the substantially longitudinal direction, and m-number of the first power supplying lines VL1 are arranged in the substantially lateral direction. The first power supplying lines VL1 transfer a first bias voltage Vp1 from the power supplying section 240 to the organic light emitting part EL. Each of the second power supplying lines VL2 extends in the substantially longitudinal direction, and m-number of the second power supplying lines VL2 are arranged in the substantially lateral direction.

The second power supplying lines VL2 transfer a second bias voltage Vp2 from the power supplying section 240 to the organic light emitting part EL. For example, each of the first power supplying lines VL1 is electrically coupled with each of upper sub pixels, and each of the second power supplying lines VL2 is electrically coupled with each of lower sub pixels.

Each of the scan lines SL extends in the substantially lateral direction, and n-number of the scan lines SL are arranged in the substantially longitudinal direction. The scan lines SL transfer scan signals S1, . . . Sq, Sq+1, . . . , Sn from the scan driving section 230 to the organic light emitting part EL.

As described above, white color balance may be modulated by applying various bias voltages to sub pixels formed in OLED panel. For example, a magnitude of the bias voltage applied to sub pixels may be adjusted according to a magnitude of the bias voltage that is applied to a sub pixel having the lowest light emitting efficiency.

Figure 19:
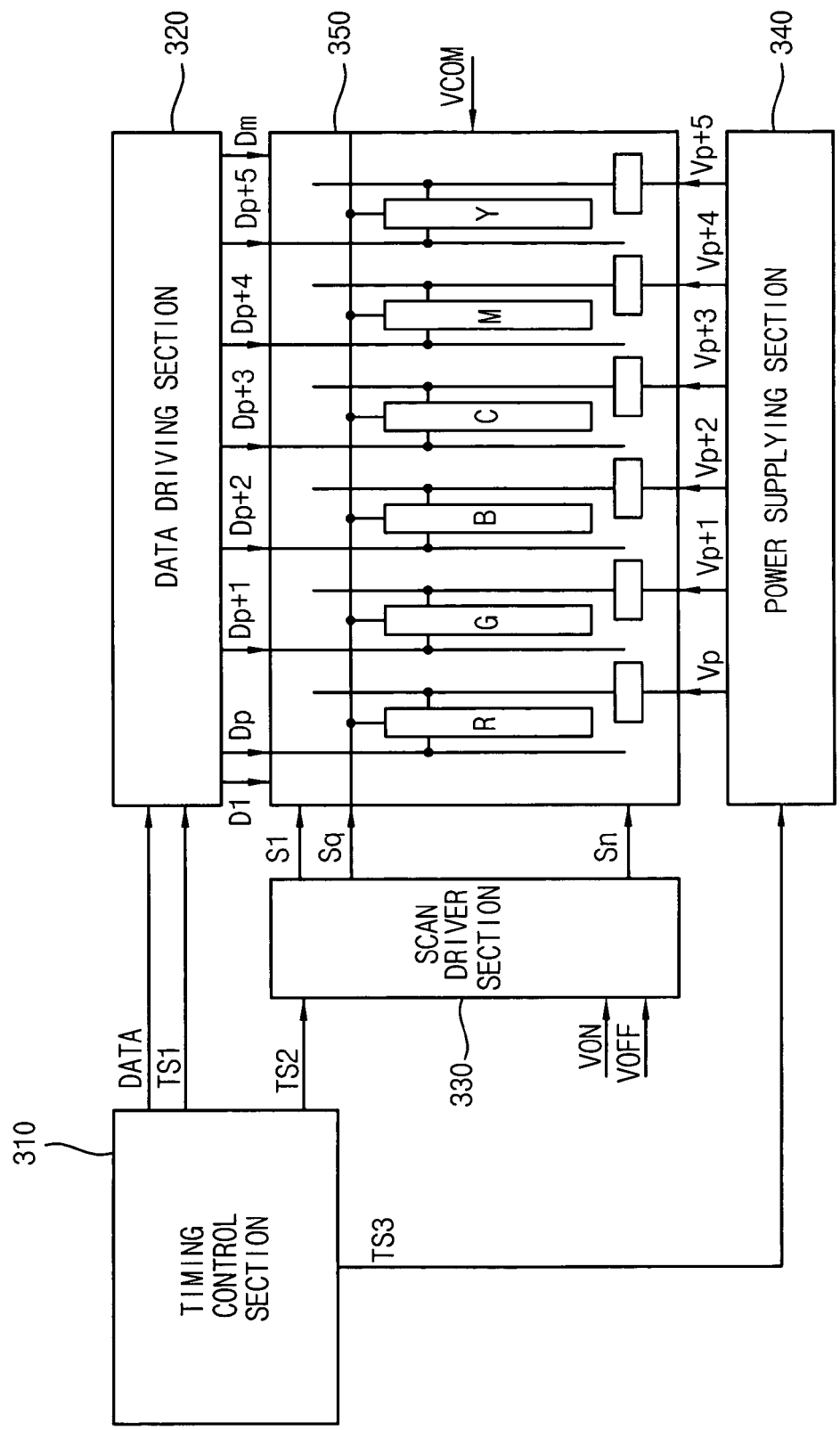
FIG. 19 is a schematic block diagram illustrating an OLED according to a fourth embodiment of the invention.

FIG. 19 is a schematic block diagram illustrating an OLED according to a fourth embodiment of the invention. The OLED in FIG. 19 has a stripe-like sub pixel structure and each sub pixel may receive a different bias voltage.

Referring to FIG. 19, an OLED includes a timing control section 310, a data driving section 320, a scan driving section 330, a power supplying section 340, and an organic light emitting panel 350.

The timing control section 310 receives an image signal DATA and control signal thereof provided from an external graphic controller (not shown) to generate first, second and third timing signals TS1, TS2 and TS3. The timing control section 310 provides the data driving section 320 with the image signal DATA and the first timing signal TS1. The timing control section 310 provides the scan driving section 330 with the second timing signal TS2. The timing control section 310 provides the power supplying section 340 with the third timing signal TS3.

The data driving section 320 receives the image signal DATA and the first timing signal TS1 from the timing control section 310 and provides the organic light emitting panel 350 with data signals D1, D2, . . . , Dp, . . . , Dm.

The scan driving section 330 receives the second timing signal TS2 from the timing control section 310 and provides the organic light emitting panel 350 with scan signals S1, S2, . . . Sq, . . . , Sn in sequence.

The power supplying section 340 receives the third timing signal TS3 from the timing control section 310 and provides the scan driving section 330 with gate on/off voltages VON/VOFF. The power supplying section 340 also provides the organic light emitting panel 350 with the common voltage VCOM and bias voltage.

The organic light emitting panel 350 includes m-number of data lines DL, m-number of power supplying lines VL, n-number of scan lines SL and organic light emitting parts EL formed in a region defined by two neighboring scan lines SL and two neighboring data lines DL. The light emitting parts EL generates a light of red, green, blue, cyan, magenta or yellow.

In detail, each of the data lines DL extends in a substantially longitudinal direction, and m-number of data lines DL are arranged in a substantially lateral direction that is opposite to the direction of the data lines DL. The data lines DL transfer the data signals D1, . . . , Dp, Dp+1, Dp+2, Dp+3, Dp+4, Dp+5, . . . , Dm from the data driving section 320 to the organic light emitting parts EL.

The power supplying line VL includes first, second, third, fourth, fifth and sixth power supplying lines VL1, VL2, VL3, VL4, VL5 and VL6.

Each of the first power supplying lines VL1 extends in the substantially longitudinal direction, and (m/6)-number of the first power supplying lines VL1 are arranged in the substantially lateral direction. The first power supplying lines VL1 transfer a first bias voltage Vp from the power supplying section 340 to the organic light emitting part EL that emits a red light.

Each of the second power supplying lines VL2 extends in the substantially longitudinal direction, and (m/6)-number of the second power supplying lines VL2 are arranged in the substantially lateral direction. The second power supplying lines VL2 transfer a second bias voltage Vp+1 from the power supplying section 340 to the organic light emitting part EL that emits a green light.

Each of the third power supplying lines VL3 extends in the substantially longitudinal direction, and (m/6)-number of the third power supplying lines VL3 are arranged in the substantially lateral direction. The third power supplying lines VL3 transfer a third bias voltage Vp+2 from the power supplying section 340 to the organic light emitting part EL that emits a blue light.

Each of the fourth power supplying lines VL4 extends in the substantially longitudinal direction, and (m/6)-number of the fourth power supplying lines VL4 are arranged in the substantially lateral direction. The fourth power supplying lines VL4 transfer a fourth bias voltage Vp+3 from the power supplying section 340 to the organic light emitting part EL that emits a cyan light.

Each of the fifth power supplying lines VL5 extends in the substantially longitudinal direction, and (m/6)-number of the fifth power supplying lines VL5 are arranged in the substantially lateral direction. The fifth power supplying lines VL5 transfer a fifth bias voltage Vp+4 from the power supplying section 340 to the organic light emitting part EL that emits a magenta light.

Each of the sixth power supplying lines VL6 extends in the substantially longitudinal direction, and (m/6)-number of the sixth power supplying lines VL6 are arranged in the substantially lateral direction. The sixth power supplying lines VL6 transfer a sixth bias voltage Vp+5 from the power supplying section 340 to the organic light emitting part EL that emits a yellow light.

As described above, white color balance may be modulated by applying various bias voltages to sub pixels formed in OLED panel having sub pixels arranged in a stripe-like structure. For example, a magnitude of the bias voltage applied to sub pixels may be adjusted according to a magnitude of the bias voltage applied to sub pixel having lowest light emitting efficiency.

According to the embodiments discussed above, characteristics of sub pixels may be adjusted according to the sub pixel having the lowest light emitting efficiency in order to tune white color balance. The characteristics of the sub pixels may be adjusted by changing a size of driver transistor, an area of light emitting region, or a magnitude of bias voltage applied to the sub pixels.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents

What is claimed is:

1. An organic light emitting device, comprising:
    a first sub pixel part comprising a first sub pixel emitting a light of a primary color; and
    a second sub pixel part comprising a second sub pixel emitting a light of a complementary color;
    wherein a specific sub pixel of the first sub pixel or the second sub pixel is selected,
    a light emitting efficiency of the sub pixels not selected is adjusted according to a light emitting efficiency of the selected sub pixel,
    the selected sub pixel is a sub pixel having the lowest light emitting efficiency,
    the first sub pixel part comprises at least one of an R-sub pixel emitting a red light, a G-sub pixel emitting a green light, and a B-sub pixel emitting a blue light, and
    the second sub pixel part comprises at least one of a C-sub pixel emitting a cyan light, an M-sub pixel emitting a magenta light, and a Y-sub pixel emitting a yellow light.

2. The organic light emitting device of claim 1, wherein each of the sub pixels comprises:
    a switching transistor comprising:
        a first current electrode coupled with a data line,
        a second current electrode, and
        a control electrode coupled with a scan line, and
    a driver transistor comprising:
        a control electrode that coupled with the second current electrode, and
        a first current electrode coupled with a power supplying line,
    wherein a size of the driver transistor of each sub pixel is adjusted to display a white color when each sub pixel emits a predetermined maximum amount of light.

3. The organic light emitting device of claim 2, wherein the size of the driver transistor corresponds with a channel width of the sub pixel.

4. The organic light emitting device of claim 1, wherein each of the sub pixels comprises:
    a switching transistor;
    a pixel electrode coupled with the switching transistor;
    a partition formed on the pixel electrode that defines a non-light emitting region that is covered by the partition and a light emitting region;
    an organic light emitting layer formed on the light emitting region to display the primary colors or the complementary colors; and
    an opposite electrode formed over the organic light emitting layer,
    wherein an area of each light emitting region is adjusted to display a white color when each sub pixel emits a predetermined maximum amount of light.

5. The organic light emitting device of claim 1, wherein each of the sub pixels comprises:
    a switching transistor;
    a pixel electrode coupled with the switching transistor;
    a partition formed on the pixel electrode that defines a non-light emitting region that is covered by the partition and a light emitting region;
    an organic light emitting layer formed on the light emitting region to display the primary colors or the complementary colors; and
    an opposite electrode formed over the organic light emitting layer, wherein a thickness of each light emitting region is adjusted to display a white color when each sub pixel emits a predetermined maximum amount of light.

6. The organic light emitting device of claim 1, wherein each of the sub pixels comprises:
a switching transistor comprising:
a first current electrode coupled with a data line;
a second current electrode; and
a control electrode coupled with a scan line and
a driver transistor comprising:
a control electrode coupled with the second current electrode
a first current electrode coupled with a power supplying line that transfers bias voltage,
wherein a magnitude of each bias voltage is adjusted to display a white color when each sub pixel emits a predetermined maximum amount of light.

7. The organic light emitting device of claim 1, wherein each of the sub pixels comprises:
a switching transistor comprising:
a first current electrode coupled with a data line;
a second current electrode; and
a control electrode coupled with a scan line; and
a driver transistor comprising:
a control electrode coupled with the second current electrode;
a first current electrode coupled with a power supplying line,
wherein the driver transistor of the first sub pixel part receives a first bias voltage, and
wherein the driver transistor of the second sub pixel part receives a second bias voltage.

8. An organic light emitting device, comprising:
an organic light emitting panel comprising a plurality of data lines, a plurality of scan lines, a plurality of power supplying lines, and a first light emitting part and a second light emitting part formed in a region defined by each of the data lines and each of the scan lines and displaying original colors and complementary colors, respectively;
a timing controller outputting image data and first, second, and third timing signals corresponding to the original colors or the complementary colors;
a data driver applying the image data to the data lines according to the first timing signal;
a scan driver applying a scan signal to the scan lines according to the second timing signal; and
a power supplier applying different bias currents to the power supplying lines according to the third timing signal.

9. The organic light emitting device of claim 8, wherein a first bias voltage is applied to the first light emitting part and a second bias voltage is applied to the second light emitting part.

10. The organic light emitting device of claim 8, wherein the original colors are red, green and blue, and
wherein different bias voltages are applied to the first light emitting parts of the red, green and blue, respectively.

11. The organic light emitting device of claim 8, wherein the complementary colors are at least one of cyan, magenta and yellow, and
wherein different bias voltages are applied to the second light emitting parts of the cyan, magenta and yellow, respectively.

12. An organic light emitting device, comprising:
a substrate;
a plurality of switching devices formed on the substrate; and
a plurality of pixel electrodes coupled with drain electrodes of the switching devices to form first, second, third, fourth, fifth, and sixth sub pixels,
wherein the first sub pixel is a red sub pixel emitting a red light,
wherein the second sub pixel is a green sub pixel emitting a green light,
wherein the third sub pixel is a blue sub pixel emitting a blue light,
wherein the fourth sub pixel is a cyan sub pixel emitting a cyan light;
wherein the fifth sub pixel is a magenta sub pixel emitting a magenta light, and
wherein the sixth sub pixel is a yellow sub pixel emitting a yellow light.

13. The organic light emitting device of claim 12, wherein the red sub pixel, the green sub pixel, the blue sub pixel, the cyan sub pixel, the magenta sub pixel and the yellow sub pixel each have a stripe-like shape and are arranged substantially linearly to form one pixel.

14. The organic light emitting device of claim 12, wherein the red sub pixel, the green sub pixel, the blue sub pixel, the cyan sub pixel, the magenta sub pixel and the yellow sub pixel are arranged in a three by two matrix-like shape.

15. The organic light emitting device of claim 12, further comprising:
a metal electrode provided on each of the pixel electrodes.

16. The organic light emitting device of claim 12, further comprising:
a transparent electrode provided on each of the pixel electrodes; and
a protection layer provided on the transparent electrode.

17. The organic light emitting device of claim 12, wherein each of the sub pixels comprises a driver transistor having a size that enables the organic light emitting device to display a white color when each of the sub pixels emits a predetermined maximum amount of light.

18. The organic light emitting device of claim 12, wherein each of the sub pixels comprises a light emitting region having a sized that enables the organic light emitting device to display a white color when each of the sub pixels emits a predetermined maximum amount of light.

19. The organic light emitting device of claim 12, wherein each of the sub pixels comprises a driver transistor having a size that enables the organic light emitting device to display a white color when each of the sub pixels emits a predetermined maximum amount of light.

* * * * *